United States Patent
Akiyama

(10) Patent No.: US 6,909,188 B2
(45) Date of Patent: Jun. 21, 2005

(54) SEMICONDUCTOR DEVICE AND MANUFACTURING METHOD THEREOF

(75) Inventor: Kazutaka Akiyama, Matsudo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 15 days.

(21) Appl. No.: 10/690,620

(22) Filed: Oct. 23, 2003

(65) Prior Publication Data

US 2004/0135267 A1 Jul. 15, 2004

(30) Foreign Application Priority Data

Oct. 24, 2002 (JP) ........................................ 2002-309871

(51) Int. Cl.[7] ............................................... H01L 23/48
(52) U.S. Cl. ...................... 257/758; 257/750; 257/751; 257/765; 257/781; 257/784; 257/786
(58) Field of Search ................................ 257/758, 784, 257/780, 786, 750, 751, 781, 770, 763–765

(56) References Cited

U.S. PATENT DOCUMENTS 6,297,563 B1    10/2001    Yamaha
6,362,528 B2     3/2002    Anand
6,579,785 B2 *   6/2003    Toyoda et al. .............. 438/597

FOREIGN PATENT DOCUMENTS

JP    10-064938    3/1998
JP    10-098039    4/1998

* cited by examiner

*Primary Examiner*—Andy Huynh
(74) *Attorney, Agent, or Firm*—Finnegan, Henderson, Farabow, Garrett & Dunner, L.L.P.

(57) ABSTRACT

There is disclosed a semiconductor device comprising a first wire and a pad portion thereof provided in a portion from an upper surface to an inner portion of a first insulation film provided above a substrate, a second insulation film provided on the first insulation film and the first wire, a second wire provided to be exposed from an upper surface of the second insulation film in an upper portion of the pad portion of the first wire, and a contact plug provided to reach an inner portion of the pad portion of the first wire from an undersurface of the second wire.

8 Claims, 14 Drawing Sheets

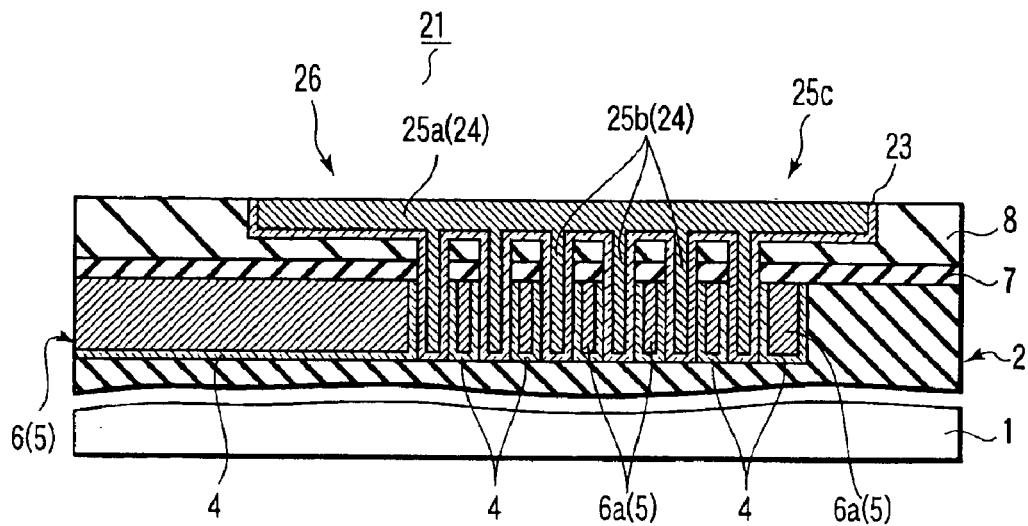
F I G. 6A
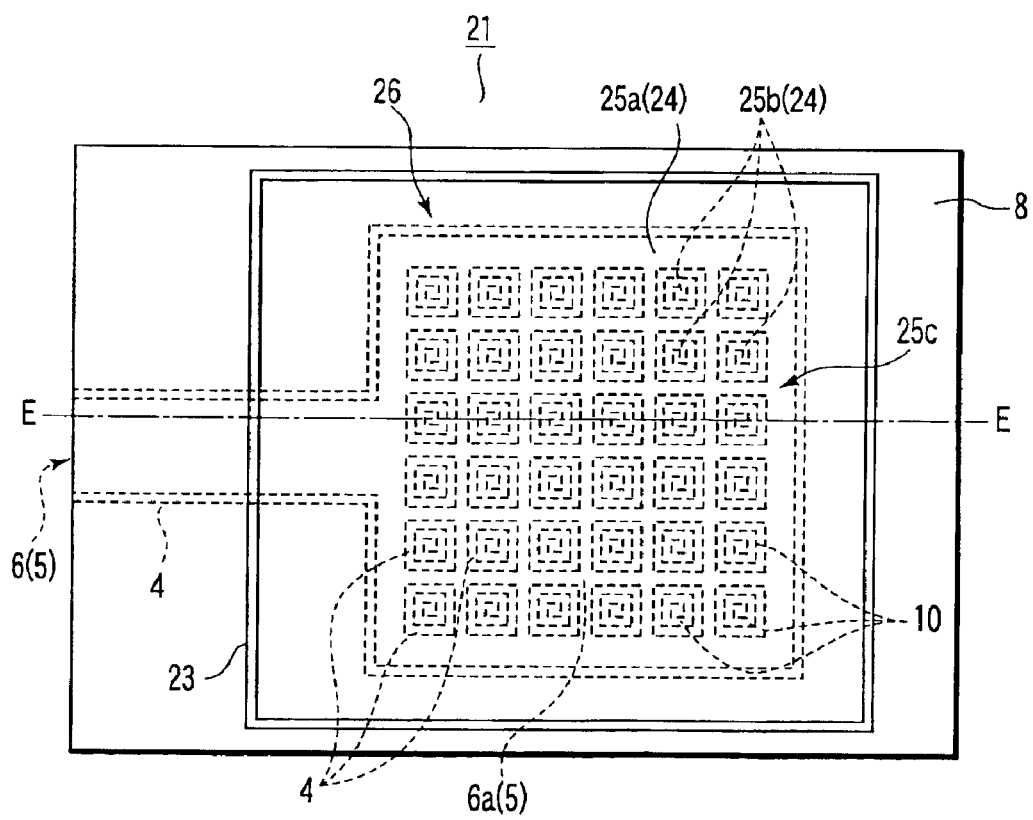
F I G. 6B

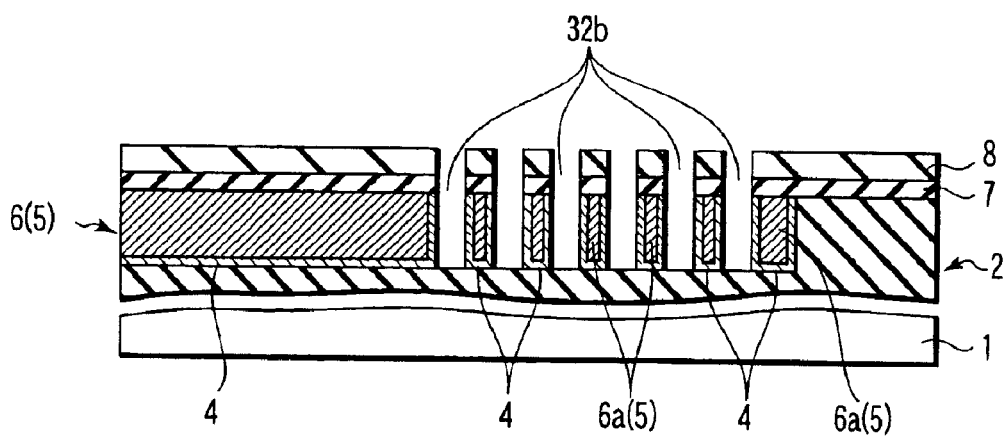
F I G. 7A
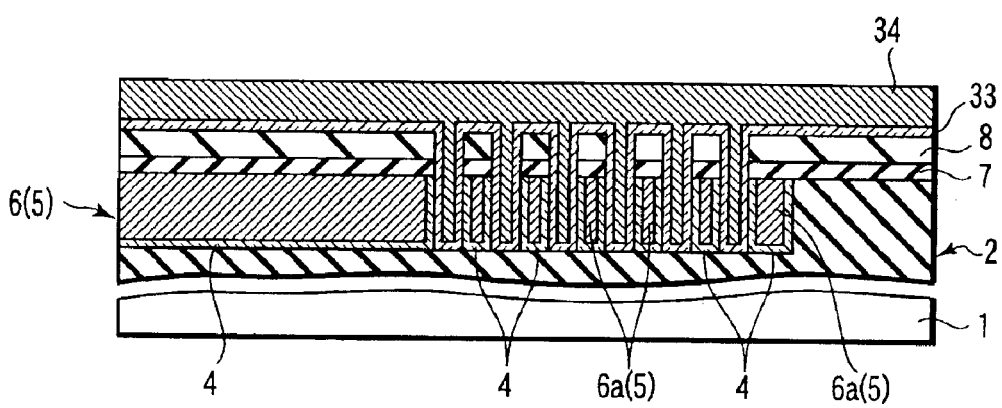
F I G. 7B
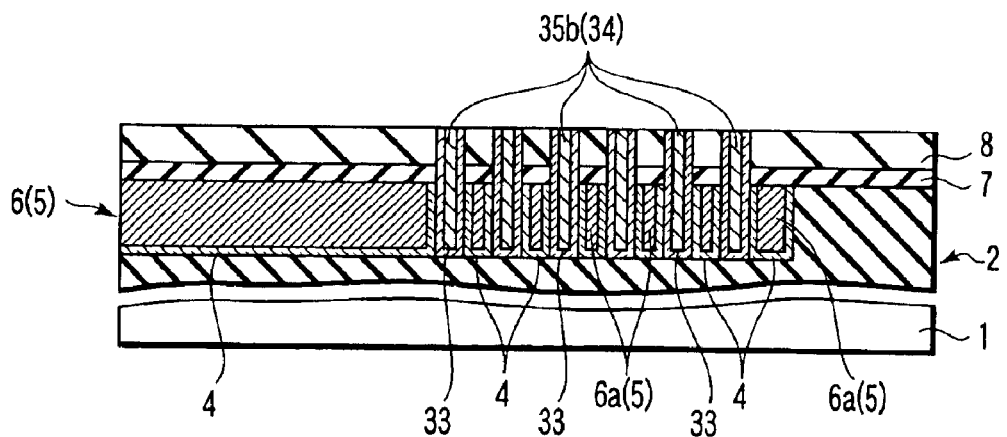
F I G. 7C

SEMICONDUCTOR DEVICE AND MANUFACTURING METHOD THEREOF

CROSS-REFERENCE TO RELATED APPLICATIONS

This application is based upon and claims the benefit of priority from the prior Japanese Patent Application No. 2002-309871, filed Oct. 24, 2002, the entire contents of which are incorporated herein by reference.

BACKGROUND OF THE INVENTION

1. Field of the Invention

The present invention relates to a technique of improving the reliability of a semiconductor device. More specifically, the present invention relates to a semiconductor device including pad portions improved in structure, and to a manufacturing method thereof.

2. Description of the Related Art

In general, various semiconductor elements formed in a semiconductor substrate (Si wafer) are electrically connected via wires (metal wires). Known techniques for forming such metal wires include a technique by which, for example, grooves are formed by applying patterning and anisotropic etching to an insulation film formed on an Si wafer, and copper (Cu) used as a line material is then filled in the grooves. A metal wire formed by such a technique is generally called a "Cu damascene wire."

Generally, the surface of the Cu damascene wire is apt to be oxidized. As such, for example, in the event of applying a bonding material onto a pad portion of the Cu damascene wire formed in a semiconductor element, when the surface of the Cu damascene wire is oxidized, the electric resistance is apt to rise at a contact between the pad portion and the bonding material. In addition, since Cu damascene wires are generally soft, when, for example, a needle of a probe used to perform electrical measurement is dropped onto a pad portion of the Cu damascene wire from an upper portion thereof, the needle can easily stick into the surface of the Cu damascene wire. Oxidation develops from a needle-stuck point, thereby causing the electric resistance to increase. To prevent the problem, aluminum (Al) wires are used to form top-layer wires onto Cu damascene wires. Generally, an Al wire has a higher oxidation resistance and hardness than Cu damascene wire. For these reasons, pad portions are formed of Al wires, not Cu damascene wires.

However, in a contact portion (connection portion) between a Cu damascene wire and an Al wire, Cu is apt to penetrate into Al. To prevent the problem, a barrier metal film (BM film) formed of a material having a high barrier property for preventing the penetration of Cu into Al needs to be provided between Cu damascene wires and Al wires. Generally, a barrier metal film between Cu damascene wires and Al wires is formed using TaN. Nevertheless, when the Cu damascene wire and the Al wires are connected to each other via the barrier metal film (TaN film) formed of TaN, connected portions therebetween tend to peel off from each other. A technique for preventing such inter-film peel is disclosed in, for example, Japanese Unexamined Patent Application Publication No. 10-98039.

BRIEF SUMMARY OF THE INVENTION

According to an aspect of the present invention, there is provided a semiconductor device comprising: a first wire and a pad portion thereof provided in a portion from an upper surface to an inner portion of a first insulation film provided above a substrate; a second insulation film provided on the first insulation film and the first wire; a second wire provided to be exposed from an upper surface of the second insulation film in an upper portion of the pad portion of the first wire; and a contact plug provided to reach an inner portion of the pad portion of the first wire from an undersurface of the second wire.

According to another aspect of the present invention, there is provided a manufacturing method of a semiconductor device, comprising: forming a recess for a first wire and a recess for a pad portion of the first wire; forming the recess for the first wire in a portion from an upper surface of a first insulation film provided above a substrate to an inner portion thereof; forming the recess for the pad portion of the first wire in continuation to the recess for the first wire while selectively leaving the first insulation film; forming the first wire and the pad portion of the first wire by burying a first conductive material into inner portions of the recess for the first wire and the recess for the pad portion of the first wire; providing a second insulation film onto the first insulation film wherein the first wire and the pad portion of the first wire are formed; forming a recess for a second wire and a contact hole by removing the second insulation film on the pad portion of the first wire and the first insulation film selectively left; and forming the second wire and a contact plug by burying a second conductive material into inner portions of the recess for a second wire and the contact hole.

According to still another aspect of the present invention, there is provided a manufacturing method of a semiconductor device, comprising: forming a recess for a first wire and a recess for a pad portion of the first wire; forming the recess for the first wire in a portion from an upper surface of a first insulation film provided above a substrate to an inner portion thereof; forming the recess for the pad portion of the first wire in continuation to the recess for the first wire while the first insulation film is selectively left; forming the first wire and the pad portion of the first wire by burying a first conductive material into inner portions of the recess for the first wire and the recess for the pad portion of the first wire; providing a second insulation film onto the first insulation film wherein the first wire and the pad portion of the first wire are formed; forming a contact hole by removing the first insulation film selectively left and second insulation film existing thereon; forming a contact plug by burying a second conductive material into an inner portion of the contact hole; providing a third insulation film on the second insulation film wherein the contact plug is formed; forming a recess for the second wire by removing the third insulation film existing on the pad portion of the first wire such that an upper surface of the contact plug is exposed; and forming the second wire by burying a third conductive material into an inner portion of the recess for the second wire.

BRIEF DESCRIPTION OF THE SEVERAL VIEWS OF THE DRAWING

FIG. 6A is a cross-portional view showing an in-process state of the semiconductor device in the manufacturing method according to the second embodiment;

FIG. 6B is a plan view showing an in-process state of the semiconductor device in the manufacturing method according to the second embodiment;

FIG. 7A is a cross-portional view showing an in-process state in a manufacturing method of a semiconductor device according to a third embodiment of the present invention;

FIG. 7B is a cross-portional view showing an in-process state of the semiconductor device in the manufacturing method according to the third embodiment;

FIG. 7C is a cross-portional view showing an in-process state of the semiconductor device in the manufacturing method according to the third embodiment;

DETAILED DESCRIPTION OF THE INVENTION

The present invention will be described in detail hereinbelow with reference to illustrated embodiments.

(First Embodiment)

Before description of a first embodiment of the present invention, the problems with the related art described above will be described in more detail with reference to comparative examples with respect to the first embodiment.

In general, Cu is apt to penetrate into Al in the contact portion (connection portion) between the Cu damascene wire and the Al wire according to the related art described above. To prevent the problem, a barrier metal film (BM film) formed of a material having high barrier property for preventing the penetration of Cu into Al needs to be provided between Cu damascene wires and Al wires. Generally, a barrier metal film between Cu damascene wires and Al wires is formed using TaN. Nevertheless, when the Cu damascene wire and the Al wires are connected to each other via the barrier metal film (TaN film) formed of TaN, connected portions therebetween tend to peel off from each other. This will be described hereinbelow with reference to the drawings.

Figure 13A:
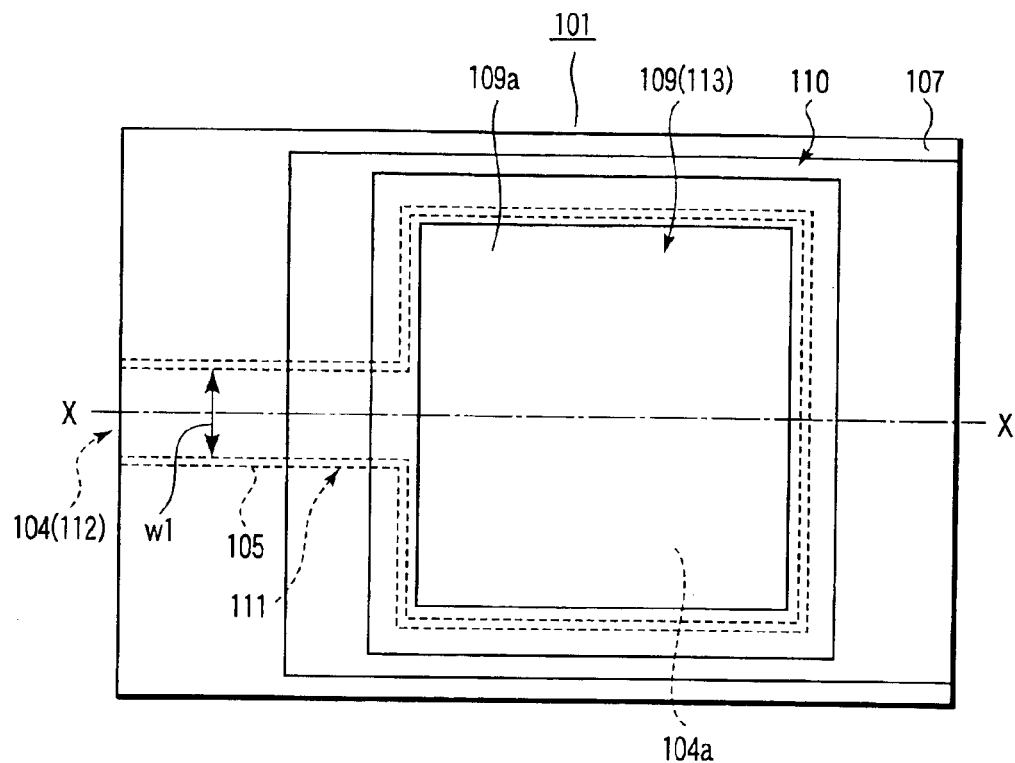
FIG. 13A is a plan view showing a semiconductor device by way of a comparative example with respect to the first embodiment.
Figure 13B:
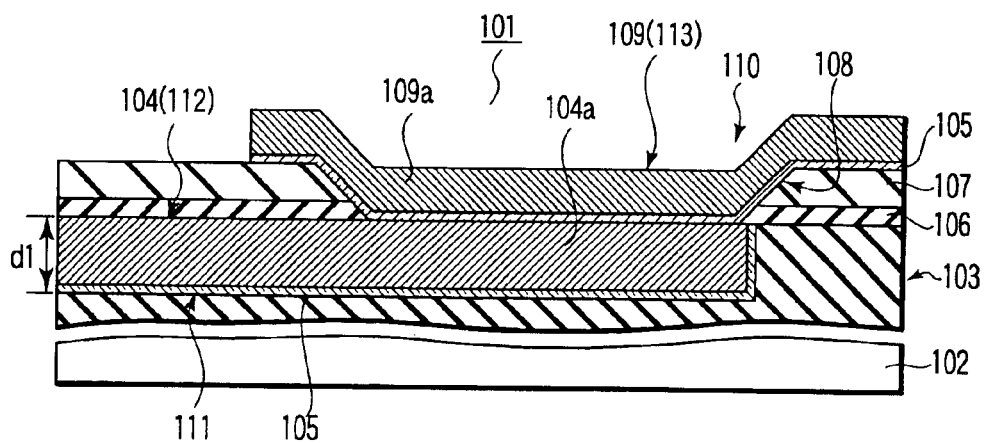
FIG. 13B is a cross-portional view showing a semiconductor device by way of a comparative example with respect to the first embodiment.

Referring to FIGS. 13A and 13B, in a semiconductor device 101, a Cu damascene wire 104 and a TaN barrier metal film 105 are formed in an inner portion of an n-th interlayer insulation film 103 (n=1 or greater integer) provided above a semiconductor substrate 102. A diffusion barrier film 106 and an insulation film 107 formed as an uppermost layer are provided onto the Cu damascene wire 104 and the interlayer insulation film 103. An Al wire 109 is formed near a pad portion opening portion 108 formed to pass through the diffusion barrier film 106 and an insulation film 107. Concurrently, the Al wire 109 is formed such that the undersurface thereof is in planar and indirect contact with the upper surface of the Cu damascene wire 104 via the TaN barrier metal film 105. In this manner, a pad portion 110 of the semiconductor device 101 is formed of the Cu damascene wire 104 and the Al wire 109 that is provided immediately above the Cu damascene wire 104 to be in planar contact therewith. FIG. 13B is a cross-portional view of the semiconductor device taken along the single-dotted chain line X—X of FIG. 13A.

Figure 14A:
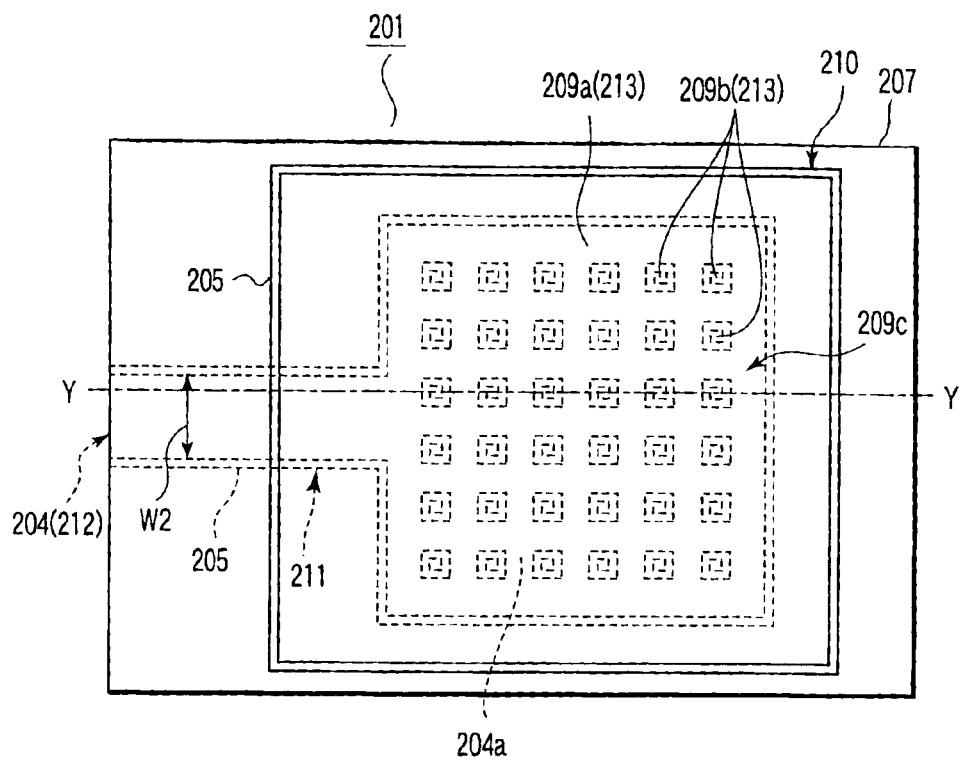
FIG. 14A is a plan view showing another semiconductor device by way of comparative example with respect to the first embodiment.
Figure 14B:
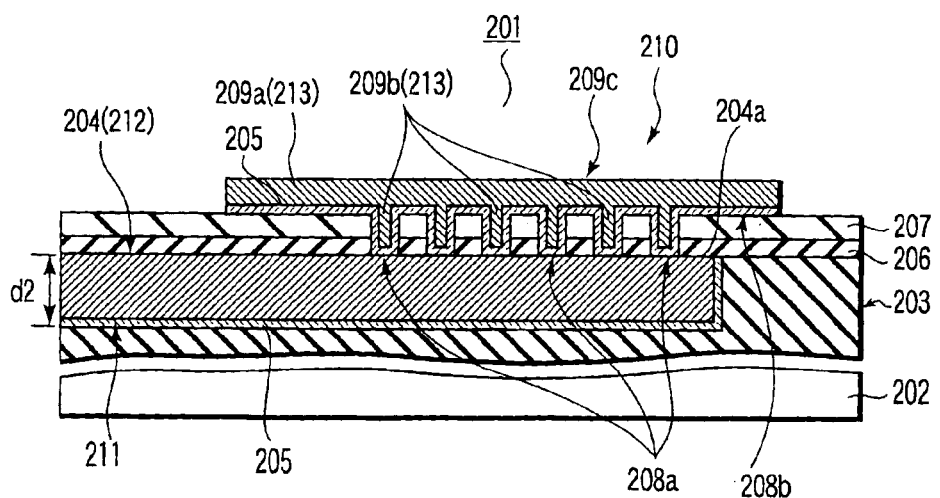
FIG. 14B is a cross-portional view showing another semiconductor device by way of comparative example with respect to the first embodiment.

A needle of a probe (not shown) is dropped over the pad portion 110 of the semiconductor device 101. Thereby, there might be a case in which the Cu damascene wire 104 and the Al wire 109 peel off from each other at a contact portion (connection portion) therebetween. To prevent such interwire peel, a semiconductor device 201 is formed to include pad portions structured as shown in FIGS. 14A and 14B. A technique of this type for preventing such inter-wire peel is disclosed in, for example, Japanese Unexamined Patent Application Publication No. 10-98039.

Similarly to the case of the semiconductor device 101 described above, in a semiconductor device 201, a Cu damascene wire 204 and a TaN barrier metal film 205 are formed in an inner portion of an n-th interlayer insulation film 203 provided above a semiconductor substrate 202. A diffusion barrier film 206 and an insulation film 207 formed as an uppermost layer are provided onto the Cu damascene wire 204 and the interlayer insulation film 203. An Al damascene wire 209 is formed above the Cu damascene wire 204 to be in indirect contact with the upper surface of the Cu damascene wire 204 via the TaN barrier metal film 205. The Al damascene wire 209 is formed of a wire main body portion 209a and via-plugs 209b integrally formed in the wire main body portion 209a. Thus, the Al via-plug 209b is not a single large via-plug, but the plurality of small via-plugs 209b are formed. Each of the via-plugs 209b is formed by depositing an Al film 213 in a via-hole 208b. The each via-plug 209b is formed such that the undersurface thereof is in indirect contact with the upper surface of the Cu damascene wire 204. Thus, a pad portion 210 of the semiconductor device 201 is formed of the Al damascene wire main body portion 209a, the individual via-plugs 209b, and the Cu damascene wire 204. FIG. 14B is a cross-portional view of the semiconductor device taken along the single-dotted chain line Y—Y of FIG. 14A.

Thus, as the semiconductor device 201, it is effective for a semiconductor device to employ the structure of the type in which planar interwire contact does not take place in order to prevent peel between the Cu damascene wire 204 and the Al damascene wire 209 in the pad portion 210. In addition, it is effective to employ the structure of the type in which the insulation films 206 and 207 are held between the Cu damascene wire 204 and the Al damascene wire 209 in order to improve the interwire adhesive property.

Generally, however, in many cases, a pad portion has wires formed in direct contact with power supply lines. In this case, depending on the semiconductor element formed in the substrate, there might be a case in which high current is supplied to flow into the pad portion. In comparison to the semiconductor device 101, in the semiconductor device 201, the area of contact between the Cu damascene wire 204 and the insulation film 207 is reduced. As compared with the Al pad portion 110 of the semiconductor device 101, immunity resistance against electromigration (EM), for example, may be deteriorated in the pad portion 210 of the semiconductor device 201.

Further, in a configuration in which multi-layer wires are formed onto a semiconductor element by forming Cu damascene wires in via-holes and grooves formed by processing an insulation film, when current is applied to the multi-layer wires for long time, conduction failure can occur at via-plugs. The defects are caused by the occurrence of electromigration resulting from the movement of Cu along the direction of the flow of electrons. Electromigration failure tends to occur with the interface of TaN barrier metal film between a Cu wire and a via-plug. Especially, electromigration failure is facilitated to occur resulting from the movement of Cu in the lower-layer Cu damascene wire immediately below the via-plug when electrons flow from the via-plug side to the side of the lower-layer Cu damascene wire via the barrier metal film. Particularly, conduction failure occurs resulting from the movement of Cu in a corner portion of the via-plug at which the electric fields tend to be concentrated. Accordingly, an object required to increase the electromigration immunity is therefore to increase the area of contact between the lower-layer Cu damascene wire and the via-plug via the barrier metal film.

The first embodiment of the present invention is designed to solve the problems described above. The object of the first embodiment is to provide a semiconductor device improved in interwire adhesive property in a pad portion, interwire electric conductivity, and reliability. Another object is to provide a method of manufacturing a semiconductor device capable of manufacturing such a semiconductor device. This will be described in detail hereinbelow.

Figure 2A:
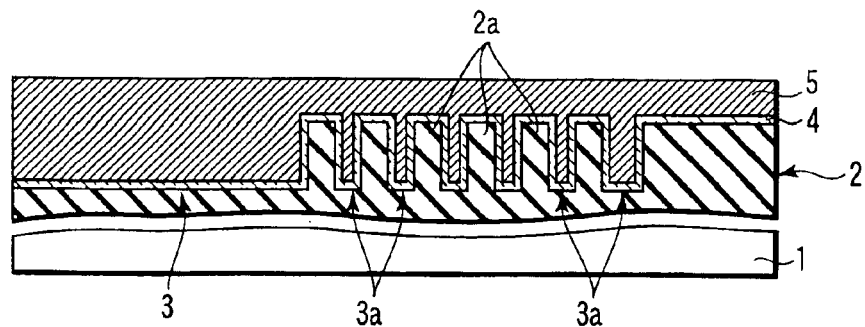
FIG. 2A is a cross-portional view showing an in-process state of the semiconductor device in the manufacturing method according to the first embodiment.
Figure 2B:
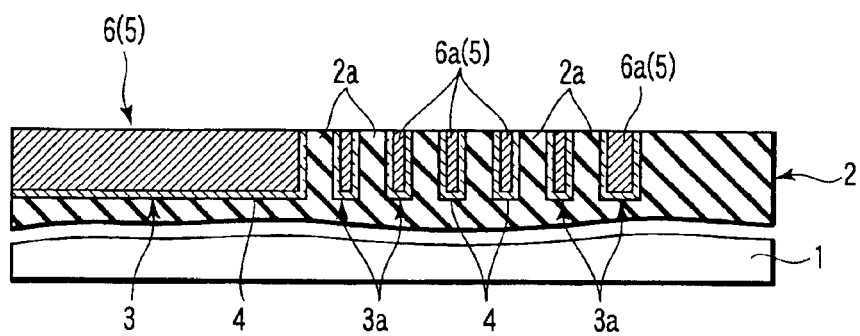
FIG. 2B is a cross-portional view showing an in-process state of the semiconductor device in the manufacturing method according to the first embodiment.
Figure 2C:
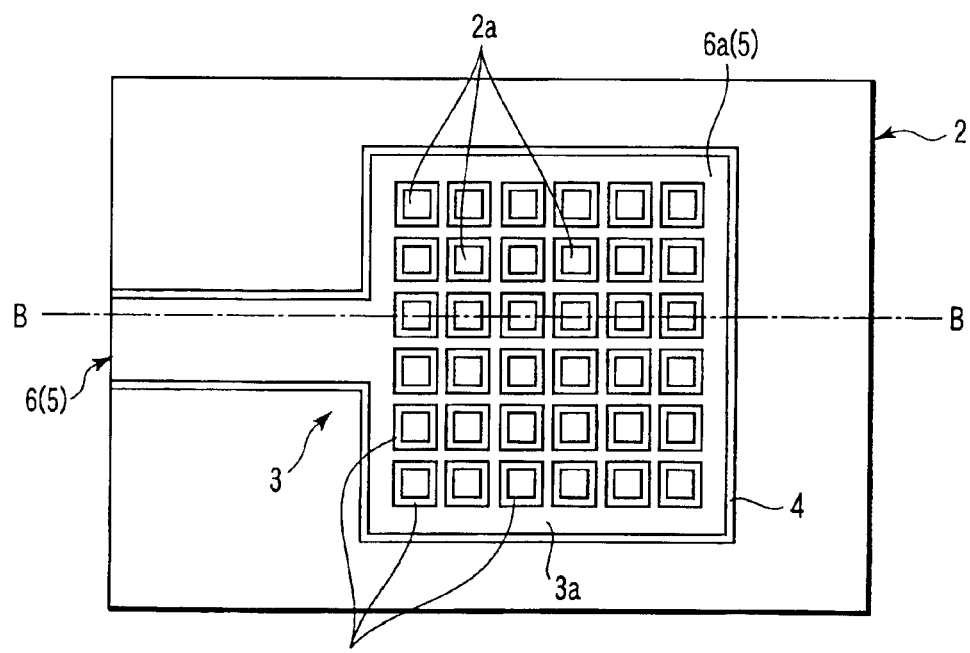
FIG. 2C is a plan view showing the in-process state of the semiconductor device in the manufacturing method according to the first embodiment.
Figure 3A:
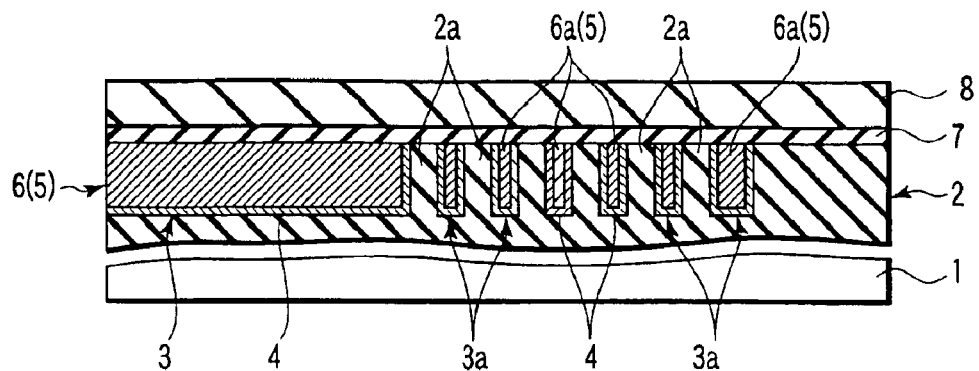
FIG. 3A is a cross-portional view showing an in-process state of the semiconductor device in the manufacturing method according to the first embodiment.
Figure 3B:
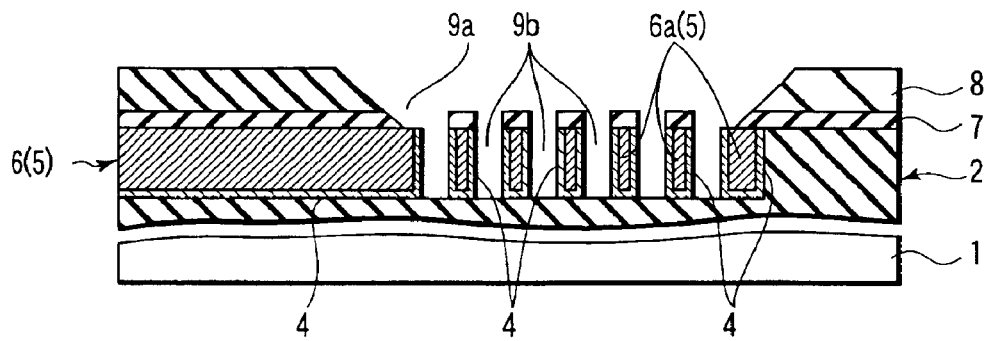
FIG. 3B is a cross-portional view showing an in-process state of the semiconductor device in the manufacturing method according to the first embodiment.
Figure 3C:
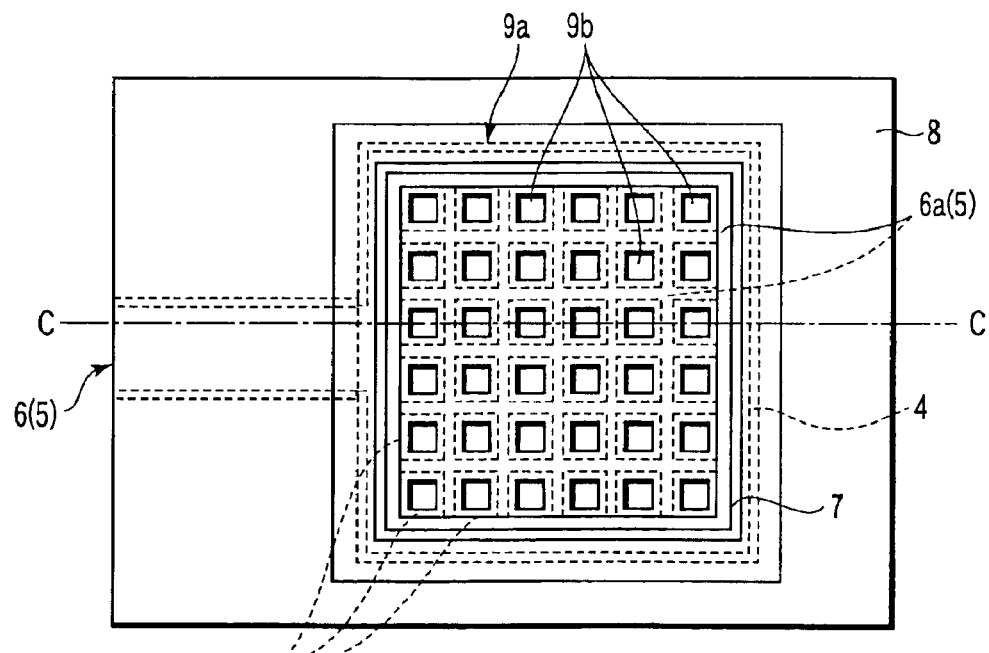
FIG. 3C is a plan view showing an in-process state of the semiconductor device in the manufacturing method according to the first embodiment.
Figure 4A:
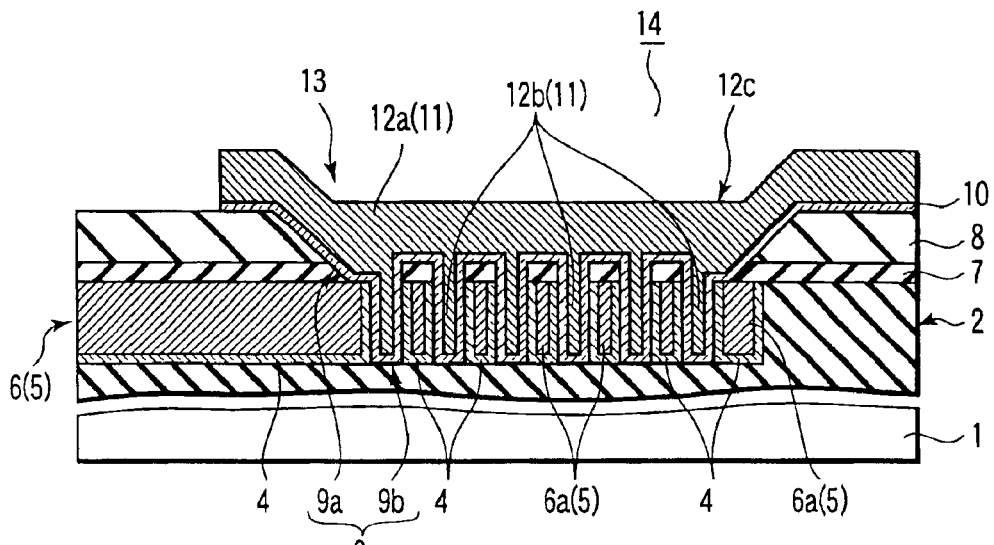
FIG. 4A is a cross-portional view showing an in-process state of the semiconductor device in the manufacturing method according to the first embodiment.
Figure 4B:
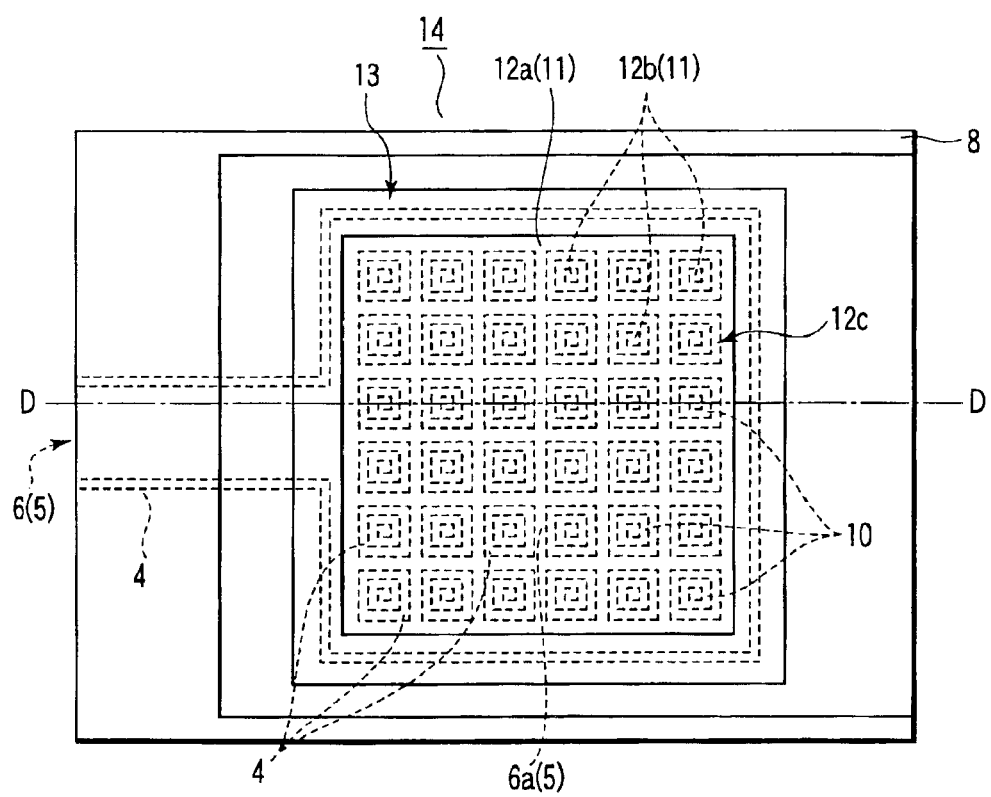
FIG. 4B is a plan view showing an in-process state of the semiconductor device in the manufacturing method according to the first embodiment.

Referring to FIGS. 1A to 4B, the first embodiment of the present invention will now be described hereunder. FIGS. 1A to 3C are cross-portional views and plan views each showing an in-process state of a semiconductor device in a manufacturing method according to the first embodiment. FIGS. 4A and 4B are a cross-portional view and a plan view, respectively, showing an in-process state of the semiconductor device and the manufacturing method according to the first embodiment. The semiconductor device of the present embodiment and the manufacturing method thereof will be described along the sequence of manufacturing steps.

Figure 1A:
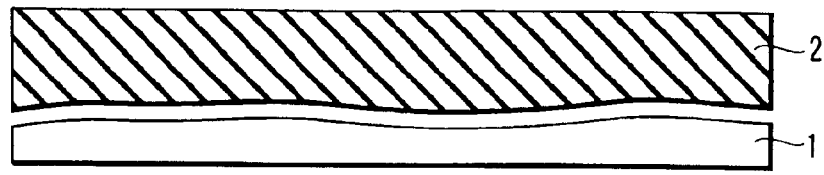
FIG. 1A is a cross-portional view showing an in-process state of a semiconductor device in a manufacturing method according to a first embodiment of the present invention.

With reference to FIG. 1A, an n-th interlayer insulation film 2 (n=1 or greater integer) is provided as a first insulation film above a silicon substrate 1 (an Si substrate or a semiconductor substrate) in which active regions, lower-layer wires, and the like, which configure various electronic circuits (not shown), are formed. More specifically, the first interlayer insulation film 2 is deposited above the surface of the silicon substrate 1 up to a thickness of about 0.5 $\mu$m by a process such as CVD. The first embodiment employs an $SiO_2$ film as the interlayer insulation film 2. In the first embodiment, one layer of the interlayer dielectric film 2 is formed above the silicon substrate 1. However, a multi-layer wire structure may be formed such that a plurality of interlayer insulation films 2 are laminated, and wires are formed in the individual interlayer insulation films 2. In such a multi-layer wire structure, a first wire 6 (described below) is formed as a top layer of the interlayer insulation films 2.

Figure 1B:
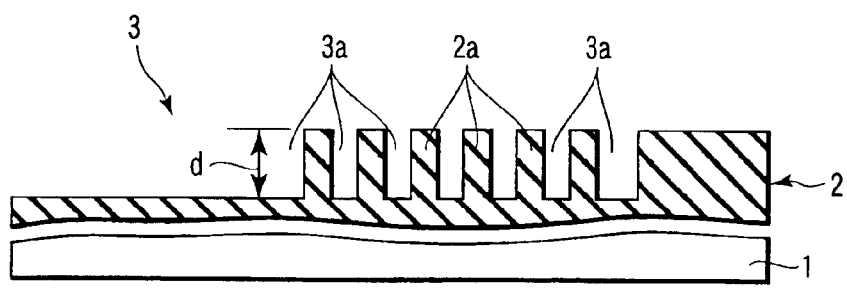
FIG. 1B is a cross-portional view showing an in-process state of the semiconductor device in the manufacturing method according to the first embodiment.
Figure 1C:
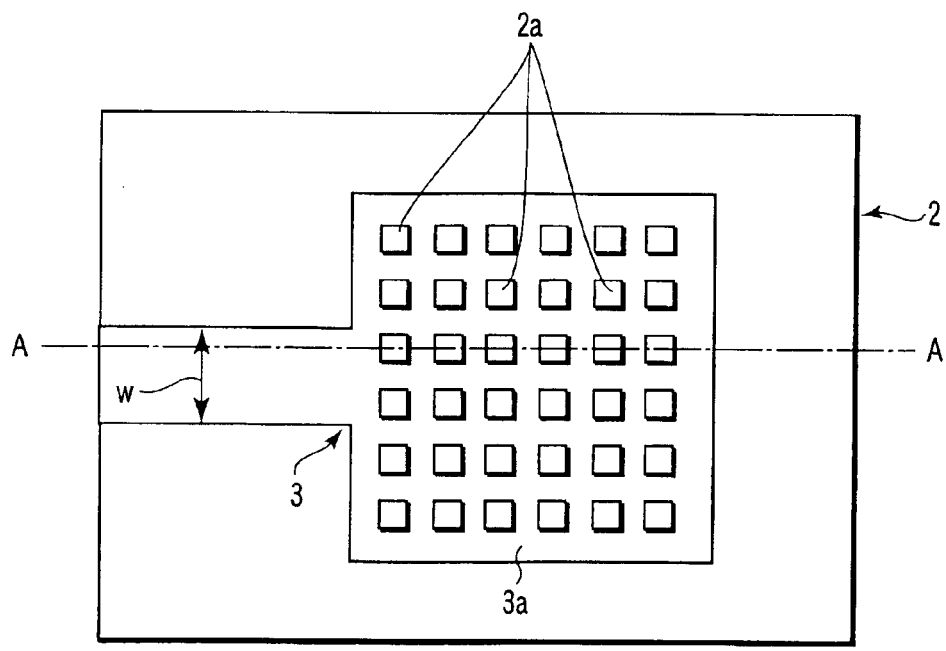
FIG. 1C is a plan view showing the in-process state of the semiconductor device in the manufacturing method according to the first embodiment.

Subsequently, referring to FIGS. 1B and 1C, a recess for a first wire 3 is formed to form a first wire 6 on the interlayer insulation film 2 ($SiO_2$ film). More specifically, a wiring pattern of the first wire 6 is patterned on the surface of the SiO$_2$ film 2 by a process such as a photoresist process. Then, the SiO$_2$ film 2 is processed by anisotropic etching using CF gas, and the recess 3 is thereby formed. For the anisotropic etching, an RIE (reactive ion etching) process is employed.

To etch the SiO$_2$ film 2, the SiO$_2$ film 2 is processed such that the recess 3 has a depth d (FIG. 1B) of about 0.4 $\mu$m and a width w (FIG. 1C) of about 0.4 $\mu$m. In the recess 3, the SiO$_2$ film 2 is processed to a predetermined size and shape to selectively remain in inner portions of recesses for a pad portion of the first wire 3a in which the pad portion 6a of the first wire 6 are formed. In the first embodiment, as shown in FIGS. 1B and 1C, the SiO$_2$ film 2 is etched such that a total of 36 substantially four-sided columnar SiO$_2$ films 2a remain in matrix (6 pieces along each of vertical and horizontal lines) in the recesses 3a. In this case, each of the SiO$_2$ films 2a etched to selectively remain is formed slightly smaller than the size of each contact hole 9b (described below) that is formed based on the SiO$_2$ film 2a. More specifically, the each SiO$_2$ film 2a is formed to have a height of about 0.4 $\mu$m and to have a plan-view size of about 0.015 $\mu$m×0.015 $\mu$m. The each SiO$_2$ film 2a in the recesses 3a hereinbelow will be referred to as "residual SiO$_2$ film 2a." FIG. 1B is a cross-portional view of the semiconductor device taken along the single-dotted chain line A—A of FIG. 1C.

Subsequently, with reference to FIG. 2A, a barrier metal film 4 and a material for forming the first wire 6 are sequentially laminated onto the surface of the SiO$_2$ film 2 and in the individual inner portions of the recess 3 and the recesses 3a. More specifically, the barrier metal film 4 is first deposited by a process such as a PVD (physical vapor deposition) process on the surface of the SiO$_2$ film 2 and the inner portion of the recess 3. For the barrier metal film 4, the present embodiment employs a TaN film (conductive ceramic layer). Subsequently, a first conductive material for forming the first wire 6 is deposited also by a PVD process onto the surface of the TaN film 4. In the present embodiment, the first wire 6 is formed by an electroplating process using copper (Cu). More specifically, a Cu plating seed layer (film) (not shown) to be used as a base of the first wire 6 is deposited onto the surface of the TaN film 4. Thereafter, a Cu film 5 used as a material for forming the first wire 6 is deposited onto the surface of the Cu plating seed layer in such a manner as to fill the inner portion of the recess 3. In this case, the TaN film 4 and the Cu plating seed layer are individually used as electrodes.

Subsequently, with reference to FIGS. 2B and 2C, unnecessary portions of the TaN film 4 and Cu film 5 are removed. More specifically, the unnecessary portions of the TaN film 4 and Cu film 5 are polished and removed by a CMP (chemical mechanical polishing) process. In this manner, unnecessary portions of the TaN film 4 and the Cu film 5, that is, portions present outside the recess 3 and the recesses 3a, are removed from the upper portions of the SiO$_2$ film 2. Thereby, the TaN film 4 and the Cu film 5 are left only in the inner portions of the recess 3 and the recesses 3a. That is, the barrier metal film 4 made of TaN and the Cu film 5 are buried in the SiO$_2$ film 2. Consequently, the so-called Cu damascene wire 6 is formed as the first wire in the inside of the SiO$_2$ film 2. In this case, the pad portions 6a of the Cu damascene wire 6 are also formed in the inside of the SiO$_2$ film 2. Hereinbelow, the each pad portion 6a of the Cu damascene wire 6 is referred to as a "Cu pad portion 6a." FIG. 2B is a cross-portional view of the semiconductor device taken along the single-dotted chain line B—B of FIG. 2C.

Subsequently, referring to FIG. 3A, a diffusion barrier film 7 (capping layer) and a second insulation film 8 (used as an (n+1)th interlayer insulation film) are sequentially laminated onto the surface of the SiO$_2$ film 2 in which the Cu damascene wire 6 and the like are formed. The second insulation film 8 functions as a pad portion insulation film. The present embodiment employs an SiN film as the diffusion barrier film 7, and employs an SiO$_2$ film as the second insulation film 8. The SiN film 7 and the SiO$_2$ film 8 are each deposited by a process such as a CVD process to a desired thickness.

Subsequently, referring to FIGS. 3B and 3C, a recess for a second wire 9a and contact holes 9b (via-holes) are formed in regions from the SiO$_2$ film 8 onto the Cu pad portions 6a to the residual SiO$_2$ film 2 in the Cu pad portions 6a. These recess 9a and the contact holes 9b are used to form a second wire 12a and contact plugs 12b (via-plugs), which will be described below. In the present first embodiment, the contact plugs 12b are formed integrally with the second wire 12a. Specifically, the second wire 12a is formed to be a so-called dual damascene structure (dual damascene wire). As such, the recess 9a is integrally formed in connection to the contact holes 9b.

In more detail, the recess 9a and the contact holes 9b are formed by a process such as an RIE process that etches and removes the residual SiO$_2$ film 2a, the SiN film 7 on the residual SiO$_2$ film 2a, and the SiO$_2$ film 8 on the Cu pad portions 6a. The recess 9a is formed to substantially pass through all the SiO$_2$ film 8 and SiN film 7 on the Cu pad portion 6a. However, the SiN film 7 on the Cu pad portions 6a is left to prevent oxidation and diffusion of the Cu pad portions 6a. The each contact hole 9b is formed by removing the residual SiO$_2$ film 2a in the Cu pad portion 6a. Concurrently, the each contact hole 9b is formed to have a plan-view size of about 0.2 $\mu$m×0.2 $\mu$m. That is, the each contact hole 9b is formed slightly larger in plan-view size than the each four-sided columnar SiO$_2$ film 2a.

In addition, in the present embodiment, the each contact hole 9b is formed to have the bottom portion (lower end portion) positioned at substantially the same height as the bottom portion (undersurface) of the pad portion 6a of the Cu damascene wire 6. That is, the each contact hole 9b is formed to pass through the Cu pad portion 6a. Thereby, the contact plug 12b is formed to have the bottom portion (lower end portion) positioned at substantially the same height as the bottom portion (undersurface) of the Cu pad portion 6a of the Cu damascene wire 6. More specifically, the each contact hole 9b is formed to a depth of about 0.4 $\mu$m that is substantially the same as the thickness of the Cu pad portion 6a of the Cu damascene wire 6. Thereby, the contact plug 12b is formed to a length of about 0.4 $\mu$m that is substantially the same as the thickness of the Cu pad portion 6a of the Cu damascene wire 6.

Either one of the recess 9a and the contact holes 9b may be formed earlier than the other. When the contact holes 9b is formed earlier than the recess 9a, the residual SiO$_2$ film 2a and the SiN film 7 and SiO$_2$ film 8 on the residual SiO$_2$ film 2a are first etched and removed. Subsequently, a material such as a mask material (not shown) is provided to prevent the SiN film 7 on the Cu pad portions 6a from being etched. Then, the SiO$_2$ film 8 remaining on the Cu pad portions 6a is etched and removed. When the recess 9a is formed earlier than the contact holes 9b, the SiO$_2$ film 8 on the Cu pad portions 6a is first etched and removed. Subsequently, a material such as a mask material (not shown) is provided to prevent the SiN film 7 on the Cu pad portions 6a from being etched. Then, the residual SiO$_2$ film 2a and the SiN film 7 on the residual SiO$_2$ film 2a are etched and removed. FIG. 3B is a cross-portional view of the semiconductor device taken along the single-dotted chain line C—C of FIG. 3C.

Subsequently, referring to FIGS. 4B and 4C, a barrier metal film 10, which is an independent object from the TaN film 4, and a forming material for the second wire 12*a* are sequentially laminated onto the surface of the SiO$_2$ film 8 and in inner portions of the recess 9*a* and contact holes 9*b*. More specifically, the barrier metal film 10 is first deposited by a process such as a PVD process on the surface of the SiO$_2$ film 8 and in the inner portions of the recess 9*a* and contact holes 9*b*. Similar to the case of the barrier film 4, the present embodiment employs a TaN film (conductive ceramic layer) as the barrier metal film 10. Subsequently, a second conductive material for forming the second wire 12*a* is deposited also by a PVD process onto the surface of the TaN film 10. In the present embodiment, the second wire 12*a* is formed by using aluminium (Al). Accordingly, an Al film 11 is deposited onto the surface of the TaN film 10 in such a manner as to fill the inner portions of the recess 9*a* and contact holes 9*b* to a desired thickness.

Subsequently, unnecessary portions of the TaN film 10 and Al film 11 are removed. More specifically, a wiring pattern of the second wire 12*a* is patterned on the surface of the Al film 11 by a process such as a photoresist process. Thereafter, a process such as an RIE process is applied to process the TaN film 10 and the Al film 11 for removing unnecessary portions of the TaN film 10 and Al film 11. Thereby, the TaN film 10 and the Al film 11 are buried in the recess 9*a*, and the second wire 12*a* is formed. Concurrently, the TaN film 10 and the Al film 11 are buried in the contact holes 9*b*, and the contact plugs 12*b* are formed. Consequently, the second wire 12*a* is formed to be a dual damascene structure formed integrally with the contact plugs 12*b* by using Al. Thus, a so-called Al dual damascene wire 12*a* is formed as the second wire 12*a* onto the pad portions 6*a* of the Cu damascene wire 6. Description hereinbelow may use the name "Al pad portion 12*c*" to refer to a portion of the Al damascene wire 12*a* above Al contact plugs 12*b* and the Cu pad portions 6*a*. Also, the Al dual damascene wire 12*a* may simply be referred to as "Al damascene wire 12*a*."

Referring to FIG. 4A, the Al damascene wire 12*a* is formed such that the undersurface is in indirect contact with the upper surface of the Cu pad portions 6*a* via the TaN film 10 and the SiN film 7. Concurrently, the each Al contact plug 12*b* is formed to have the bottom portion (lower end portion) positioned at substantially the same height as the bottom portion (undersurface) of the Cu pad portion 6*a*. The each Al contact plug 12*b* is formed to a length of about 0.4 μm that is substantially the same as the thickness of the Cu pad portion 6*a*. Thus, the each Al contact plugs 12*b* is formed such that the outer portion (outer surface) thereof is in contact with an inner portion (inner surface) of the Cu pad portions 6*a* via the TaN film 4 and the TaN film 10. In this manner, the Al pad portion 12*c* is formed in the shape to be fitted to the Cu pad portions 6*a* via the Al contact plug 12*b* formed to substantially pass through the Cu pad portions 6*a*. That is, the Al pad portion 12*c* and the Cu pad portions 6*a* are formed to be non-planar contact with each other.

Subsequently, predetermined steps are carried out, and a desired semiconductor device 14 is obtained, referring to FIGS. 4A and 4B. The semiconductor device 14 has a pad portion 13 structured such that the Al damascene wire 12*a* and the Cu damascene wire 6 are in three-dimensional contact (connection) with each other in the respective Cu pad portions 6*a* and Al damascene wire 12*a*. The Al damascene wire 12*a* is electrically connected to the Cu damascene wire 6 mainly via the Al contact plugs 12*b*. FIG. 4A is a cross-portional view along with the single-dotted chain line D—D of FIG. 4B.

Description is now provided hereinbelow regarding manufacturing methods of comparative examples and tests performed by the inventors and the results of the tests with reference to FIGS. 4A, 4B, 13A, 13B, and 14A, and 14B. The tests were performed to evaluate reliability of the semiconductor device which was formed of the Cu wire whose pad portions were different in their materials and the Al wire, in two aspects, the one being the structure and the other being the electrode characteristics.

Semiconductor devices represented by the semiconductor devices 14 shown in FIGS. 4A and 4B and described above were selected by way of first samples (according to the first embodiment). Second samples were selected from semiconductor devices represented by the related-art semiconductor device 101 shown in FIGS. 13A and 13B. Third samples were selected from semiconductor devices represented by the related-art semiconductor device 201 shown in FIGS. 14A and 14B. The semiconductor devices 101 and 201 are comparative examples (comparative samples) with respect to the semiconductor device 14. Hereinbelow, the manufacturing method of each of the semiconductor devices 101 and 201 selected by way of as the comparative examples of the two types will be concisely described along the sequence of manufacturing steps.

FIRST COMPARATIVE EXAMPLE

Referring to FIGS. 13A and 13B, an SiO$_2$ film 103 is deposited as an interlayer insulation film by a process such as CVD process to a thickness of about 0.5 μm above an Si substrate 102 in which active regions configuring various electronic circuits (not shown), lower-layer wires, and the like are formed. Subsequently, a wiring pattern of a Cu damascene wire 104 is patterned on the surface of the SiO$_2$ film 103 by a photoresist process. Then, the SiO$_2$ film 103 is processed by anisotropic etching (RIE processing) using a CF gas, and a recess for the Cu damascene wire 111 is thereby formed. In this case, the SiO$_2$ film 103 is processed to the extent that a depth d1 of the recess 111 shown in FIG. 13B is about 0.4 μm, and a width w1 of the recess 111 shown in FIG. 13A is about 0.2 μm.

A TaN film 105, which works as a barrier metal film, and a Cu film 112, which is used as a material for forming the Cu damascene wire 104, are sequentially laminated by a PVD process onto the surface of the SiO$_2$ film 103 and in an inner portion of the recess 111. The Cu film 112 is formed in the following manner. First, a Cu plating seed layer (film) (not shown) to be used as a base is deposited onto the surface of the TaN film 105. Thereafter, the Cu film 112 is deposited in such a manner as to fill the inner portion of the recess 111. In this case, the TaN film 105 and the Cu plating seed layer are individually used as electrodes. Subsequently, portions of the TaN film 105 and Cu film 112 above the surface of the SiO$_2$ film 103 are polished and removed. In this manner, the TaN film 105 and the Cu film 112 are buried in the SiO$_2$ film 103, and the Cu damascene wire 104 is thereby formed.

Subsequently, an SiN film 106, which works as a diffusion barrier film (capping layer), and an SiO$_2$ film 107, which works as a pad portion insulation film, are sequentially laminated by a CVD process onto the SiO$_2$ film 103, the Cu damascene wire 104, and the like. Subsequently, a single pad portion opening portion 108 (a contact hole or via-hole) is formed by an RIE process to a plan-view size of about 40 μm×40 μm, which is slightly smaller than the size of a Cu pad portion 104a. The opening portion 108 is formed to pass through the SiN film 106 and the SiO$_2$ film 107 above the Cu pad portion 104a of the Cu damascene wire 104.

Subsequently, the TaN film 105, which works as a barrier metal film, and an Al film 113, which is used as a material for forming the Al wire 109, are sequentially laminated by a PVD process onto the surface of the SiO$_2$ film 107 and in an inner portion of the pad portion opening portion 108. Then, a wiring pattern of the Al wire 109 is patterned by a photoresist processing on the surface of the Al film 113. Thereafter, the TaN film 105 and the Al film 113 are processed by an RIE process, and unnecessary portions of the TaN film 105 and the Al film 113 are removed. Thereby, the Al wire 109 is formed. Of the Al wire 109, a portion that is in indirect contact with the Cu damascene wire 104 via the TaN film 105 is used as a pad portion 109a of the Al wire 109. The Al pad portion 109a can be regarded as one large via-plug (contact plug) formed in the Al wire 109.

Referring to FIGS. 13A and 13B, in the semiconductor device 101, the Cu damascene wire 104 and the Al wire 109 are in indirect and substantially planar contact with each other via the TaN film 105 in the Cu pad portion 104a and the pad portion 109a (Al via-plug or Al contact plug). That is, the pad portion 110 of the semiconductor device 101 is structured such that the Cu damascene wire 104 and the Al wire 109 are in indirect and substantially planar contact with each other via the TaN film 105. FIG. 13B is a cross-portional view of the semiconductor device taken along the single-dotted chain line X—X of FIG. 13A.

SECOND COMPARATIVE EXAMPLE

Referring to FIGS. 14A and 14B, an SiO$_2$ film 203 is deposited as an interlayer insulation film by a process such as a CVD process to a thickness of about 0.5 μm above an Si substrate 202 in which active regions configuring various electronic circuits (not shown), lower-layer wires, and the like are formed. Subsequently, a wiring pattern of a Cu damascene wire 204 is patterned on the surface of the SiO$_2$ film 203 by a photoresist process. Then, the SiO$_2$ film 203 is processed by anisotropic etching (RIE processing) using a CF system gas, and a recess for the Cu damascene wire 211 is thereby formed. In this case, the SiO$_2$ film 203 is processed to the extent that a depth d2 of the recess 211 shown in FIG. 14B is about 0.4 μm, and a width w2 of the recess 211 shown in FIG. 14A is about 0.2 μm.

A TaN film 205, which works as a barrier metal film, and a Cu film 212, which is used as a material for forming the Cu damascene wire 204, are sequentially laminated by a PVD process onto the surface of the SiO$_2$ film 203 and in an inner portion of the recess 211. The Cu film 212 is formed in the following manner. First, a Cu plating seed layer (film) (not shown) to be used as a base is deposited onto the surface of the TaN film 205. Thereafter, the Cu plating seed layer is deposited in such a manner as to fill the inner portion of the recess 211. In this case, the TaN film 205 and the Cu plating seed layer are individually used as electrodes. Subsequently, portions of the TaN film 205 and Cu film 212 above the surface of the SiO$_2$ film 203 are polished and removed. In this manner, the TaN film 205 and the Cu film 212 are buried in the SiO$_2$ film 203, and the Cu damascene wire 204 is thereby formed.

Subsequently, an SiN film 206, which works as a diffusion barrier film (capping layer), and an SiO$_2$ film 207, which works as a pad portion insulation film, are sequentially laminated by a CVD process onto the SiO$_2$ film 203, the Cu damascene wire 204, and the like. Then, the SiN film 206 and the SiO$_2$ film 207 above a Cu pad portion 204a of the Cu damascene wire 204 are processed by an RIE process, and recesses for the damascene wire 208a and via-holes 208b (contact holes) are thereby formed. In the semiconductor device 201, via-plugs 209b are formed integrally with a damascene wire 209a. Specifically, the Al damascene wire 209a is formed to be a so-called dual damascene structure (dual damascene wire). The recesses 208a are formed integrally with the via-holes 208b in continuation thereto.

In the semiconductor device 201, the pad portion 210 is formed to a plan-view size of about 40 μm×40 μm. In the pad portion 210, 400 Al via-plugs 209b each having a plan-view size of about 1 μm×1 μm are formed. Accordingly, 400 via-holes 208b each having a plan-view size of 1 μm×1 μm are formed within a region of about 40 μm×40 μm. FIG. 14A shows only 36 of 400 Al via-plugs 209b for the purpose of simplicity.

Subsequently, the TaN film 205, which works as a barrier metal film, and an Al film 213, which is used as a material for forming the damascene wire 209a and the via-plugs 209b, are sequentially laminated by a PVD process onto the surface of the SiO$_2$ film 207 and in individual inner portions of the recesses 208a and the via-holes 208b. Then, a wiring pattern of the damascene wire 209a is patterned by a photoresist process on the surface of the Al film 213. Thereafter, the TaN film 205 and the Al film 213 are processed by an RIE process, and unnecessary portions of the TaN film 205 and the Al film 213 are removed. Thereby, an Al dual damascene wire 209a integrated with the via-plugs 209b is formed as an Al dual damascene wire 209 (which hereinbelow will simply be referred to as the "Al damascene wire 209."). Of the Al damascene wire 209a, a portion above the Al via-plugs 209b and the Cu pad portions 204 is used as a pad portion 209c of the Al damascene wire 209.

As shown in FIGS. 14A and 14B, in the semiconductor device 201, the lower end portions of the 400 Al via-plugs 209b and the upper surface of the Cu pad portion 204a are in indirect contact with each other via the TaN film 205. More specifically, in comparison with the pad portion 110 of the semiconductor device 101 formed as the first comparative example, the structure of the first comparative example is characterized in that the Cu pad portion 204a and the pad portion 209c are substantially in indirect point contact with each other via the TaN film 205. Consequently, the contact area between the Cu damascene wire 204 and the Al damascene wire 209a is reduced, in comparison with the pad portion 110 of the semiconductor device 101 of the first comparative example. However, to secure a sufficient adhesion property between the Cu damascene wire 204 and the Al damascene wire 209a, the SiN film 206 and the SiO$_2$ film 207 are left (held) between the individual Al via-plugs 209b and between the Cu damascene wire 204 and the Al damascene wire 209a. FIG. 14B is a cross-portional view of the semiconductor device taken along the single-dotted chain line Y—Y of FIG. 14A.

Tests were conducted to examine mechanical strengths and electrical characteristics of the above-described first to third samples, namely, the pad portions 13, 110, and 210 (Al pad portions 12c, 109a, and 209c) of the respective semiconductor devices 14, 101, and 201, under the same conditions.

First, with regard to 100 semiconductor devices 14 according to the first embodiment, the mechanical strengths of pad portions 13 (Al pad portions 12c) were evaluated. As a result, no peel was verified to occur between the individual Al damascene wires 12a and Cu damascene wires 6 in all the pad portions 13. With regard to 100 semiconductor devices 14, the electromigration (EM) immunities were evaluated for all the pad portions 13. As a result, the tolerable current density was verified to be 8 mA/um$^2$ in each of the all pad portions 13.

Subsequently, with regard to 100 semiconductor devices 101 of the first comparative examples, the mechanical strengths of pad portions 110 (Al pad portions 109a) were evaluated. As a result, in the pad portion 110 of each of the 10 semiconductor devices 101, peel was verified to occur at the interface between the TaN film 105, which is provided between the Al damascene wire 109 and the Cu damascene wire 104, and the upper surface of the Cu damascene wire 6. In addition, with regard to 100 semiconductor devices 14, electromigration (EM) immunities of the all pad portions 110 were evaluated. As a result, the tolerable current density was verified to be 4 mA/um$^2$ in each of the all pad portions 110, which was lower than that in the first embodiment. Concurrently, the service life was verified to be short.

Subsequently, with regard to 100 semiconductor devices 201 of the second embodiment, the mechanical strengths of pad portions 210 (Al pad portions 209c) were evaluated. As a result, in the pad portion 210 of each of the all semiconductor devices 201, no peel was verified to occur between the Al damascene wire 209 and the Cu damascene wire 204. In addition, with regard to 100 semiconductor devices 201, electromigration (EM) immunities of the all pad portions 210 were evaluated. As a result, the tolerable current density was verified to be 2 mA/um$^2$ in each of the all pad portions 210, which was further lower than that in the first embodiment. Concurrently, the service life was verified to be short, as in the case of the first comparative example.

As described above, according to the first embodiment, the Al dual damascene wire 12a is formed such that the undersurface thereof is in indirect contact with the upper surfaces of the Cu pad portions 6a (Cu damascene wire 6) in the Al pad portion 12c. In addition, the each Al contact plug 12b is formed such that the outer surface thereof is in indirect contact with the inner surface of the corresponding Cu pad portion 6a. More specifically, the each Al contact plug 12b is formed such that the cross portion thereof is shaped like a so-called wedge or a comb toothing and is fitted to the Cu pad portion 6a. Consequently, the Al dual damascene wire 12a and the Cu damascene wire 6 are formed to be three-dimensional and in indirect contact with each other.

The thus-structured semiconductor device 14 according to the first embodiment has an increased area of contact between the Al dual damascene wire 12a and the Cu damascene wire 6 in the pad portion 13. Accordingly, the present embodiment exhibits improved adhesive property (adhesive strength) between the Al dual damascene 12a and the Cu damascene wire 6 in the pad portion 13, as compared with the semiconductor device according to the related art in which the Al wire and the Cu wire are in planar contact with each other in the pad portion. In addition, the present embodiment exhibits a reduced current density per unit area in the pad portion 13. Thereby, the embodiment is improved in electromigration immunity and is hence improved in the electric conductivity between the Al dual damascene wire 12a and the Cu damascene wire 6.

In more detail, in the semiconductor device 14, there occurs no undesired case in which peel occurs on the interface between conductors such as the Al dual damascene wire 12a and the Cu damascene wire 6 in the pad portion 13, and appropriate EM immunity can be secured therein. Thus, the semiconductor device 14 of the present embodiment is improved in the adhesive property and electric conductivity between wires in the pad portion 13 and is consequently improved in reliability. Further, according to the manufacturing method of the semiconductor device of the present embodiment, the manufacture of the semiconductor device 14 described above can easily be implemented.

(Second Embodiment)

Figure 5A:
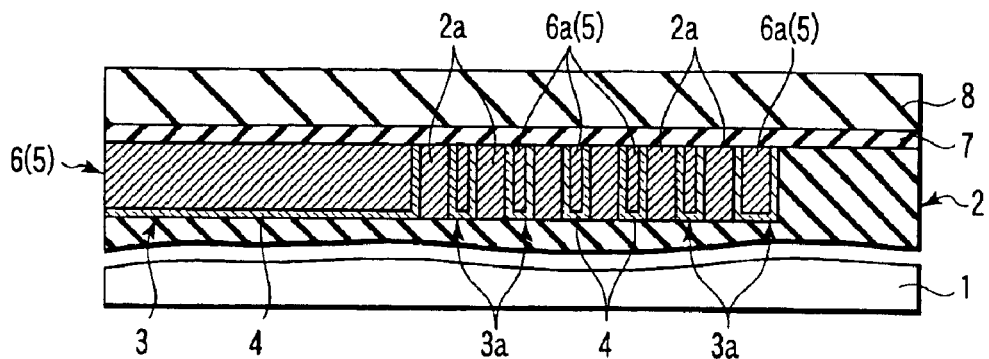
FIG. 5A is a cross-portional view showing an in-process state in a manufacturing method of a semiconductor device according to a second embodiment of the present invention.

Referring to FIGS. 5A to 6B, a second embodiment of the present invention will now be described hereunder. FIGS. 5A to 5C are cross-portional views each showing an in-process state of a semiconductor device in a manufacturing method according to the second embodiment. FIGS. 6A and 6B are a cross-portional view and a plan view, respectively, each showing an in-process state of the semiconductor device and the manufacturing method thereof according to the second embodiment. The same numerals are used to refer to the same portions as those in the first embodiment, and detailed description thereof will be omitted therefrom.

As in the first embodiment, the second wire is formed to be a dual damascene structure in the second embodiment. The semiconductor device according to the present embodiment and the manufacturing method thereof will be described collectively along the sequence of manufacturing steps.

With reference to FIG. 5A, using steps similar to those in the first embodiment, an SiN film 7 and an SiO$_2$ film 8 are sequentially laminated onto an SiO$_2$ film 2 in which a Cu damascene wire 6 and the like are formed.

Figure 5B:
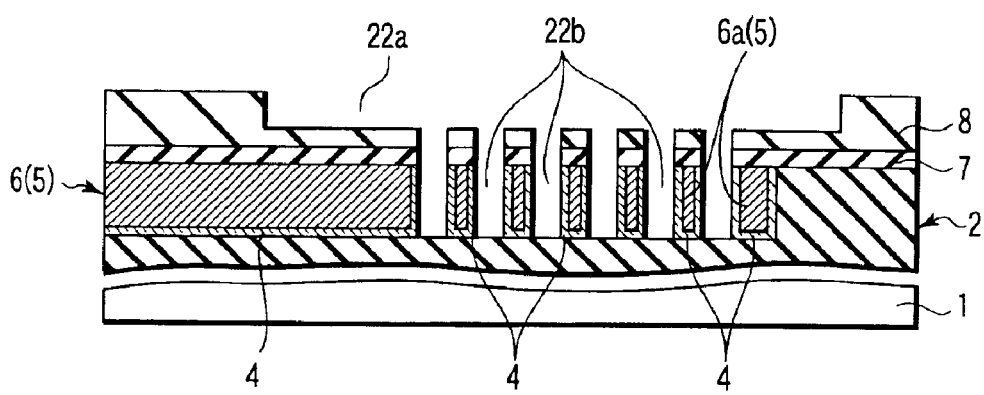
FIG. 5B is a cross-portional view showing an in-process state of the semiconductor device in the manufacturing method according to the second embodiment.

Subsequently, referring to FIG. 5B, a recess for a second wire 22a and contact holes 22b are formed in portions extending from the upper surface of the SiO$_2$ film 8 on the Cu pad portion 6a to the inner portions of the residual SiO$_2$ film 2 in the Cu pad portions 6a. Similarly to the second wire 12a in the first embodiment described above, also a second wire 25a is formed in integration with contact plugs 25b. In the present embodiment, the contact plugs 25b are formed integrally with the second wire 25a. Specifically, the second wire 25a is formed to be a dual damascene structure (dual damascene wire). As such, the recess 22a is integrally formed in connection to the contact holes 22b.

In more detail, the recess 22a and the contact holes 22b are formed by etching and removing residual SiO$_2$ film 2a, the SiN film 7 on the residual SiO$_2$ film 2a, and the SiO$_2$ film 8 on the Cu pad portions 6a. In this case, the recess 22a is formed by removing a SiO$_2$ film 8 from its upper surface (surface) to its inner portion (intermediate portion) in an upper portion 6a. That is, the recess 22a is formed in such a form not to penetrate into the SiO$_2$. Accordingly, the SiN film 7 and SiO$_2$ are left on the Cu pad portion 6a. Thus, the second wire 25a is formed such that the under surface thereof is spaced apart from the upper face of the pad portion 6a of the Cu damascene 6 working as the first wire.

The contact holes 22b are formed by etching and removing the residual SiO$_2$ film 2a, the SiN film 7 on the residual SiO$_2$ film 2a, and the SiO$_2$ film 8 on the residual SiO$_2$ film 2a to communicate with the bottom portion of the recess 22a. Similar to the each contact hole 9b in the first embodiment, the each contact hole 22b in the present embodiment is also formed to have the bottom portion (undersurface) positioned at substantially the same height as the bottom portion (undersurface) of the Cu pad portion 6a. That is, the each contact hole 22b is formed to pass through the Cu pad portion 6a. Similar to the recess 9a and the contact holes 9b in the first embodiment, either one of the recess 22a and the contact holes 22b may be formed earlier than the other.

Figure 5C:
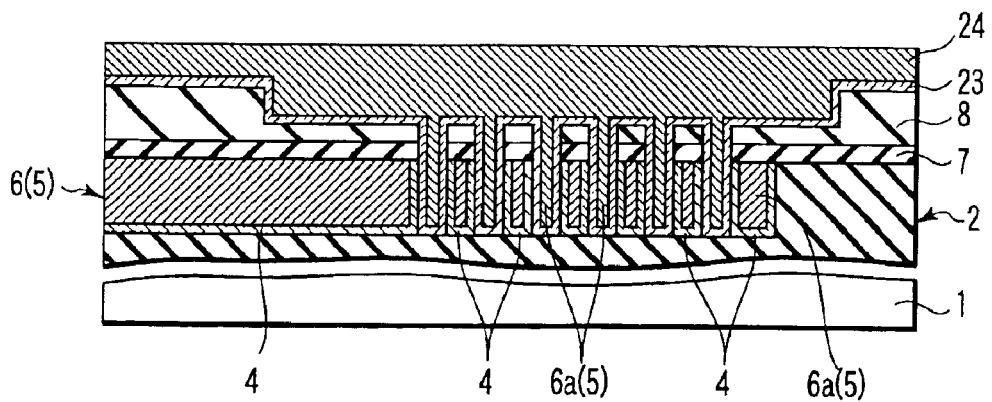
FIG. 5C is a cross-portional view showing an in-process state of the semiconductor device in the manufacturing method according to the second embodiment.

Subsequently, referring to FIG. 5C, a barrier metal film 23 (TaN film), which is an independent object from the TaN film 4, and a forming material for the second wire 25a are sequentially laminated onto the surface of the $SiO_2$ film 8 and in individual inner portions of the recess 22a and contact holes 22b. More specifically, the TaN film 23, which works as the barrier metal film, is first deposited by a PVD process on the surface of the $SiO_2$ film 8 and in the individual inner portions of the recess 22a and contact holes 22b. Subsequently, an Al film 24 to be used as a forming material for the second wire 25a is deposited also by a PVD process onto the surface of the TaN film 23 in such a manner as to fill the individual inner portions of the recess 22a and contact holes 22b to a desired thickness.

Subsequently, referring to FIG. 6A, unnecessary portions of the TaN film 23 and Al film 24 are removed. More specifically, a wiring pattern of the second wire 25a is patterned on the surface of the Al film 24 by a process such as a photoresist process. Thereafter, a process such as an RIE process is applied to process the TaN film 23 and the Al film 24 for removing unnecessary portions of the TaN film 23 and Al film 24. Thereby, the TaN film 23 and the Al film 24 are buried in the recess 22a, and the second wire 25a is formed. Concurrently, the TaN film 23 and the Al film 24 are buried in the contact holes 22b, and the contact plugs 25b are formed. Consequently, the second wire 25a is formed to be a dual damascene structure formed integrally with the contact plugs 25b by using Al. Thus, an Al dual damascene wire 25a is formed as the second wire 25a above the pad portions 6a of the Cu damascene wire 6. Description hereinbelow may use the name "Al pad portion 25c" to refer to a portion of the Al dual damascene wire 25a above the Al contact plugs 25b and the Cu pad portions 6a. Also, the Al dual damascene wire 25a may simply be referred to as the "Al damascene wire 25a."

Subsequently, predetermined steps are carried out, and a semiconductor device 21 is obtained, as shown in FIGS. 6A and 6B. Specifically, the semiconductor device 21 has a pad portion 26 structured such that the undersurface of the Al pad portion 25c is spaced apart from the upper surface of the Cu pad portions 6a. In addition, the Al pad portion 25c and the Cu damascene wire 6 are in three-dimensional contact (connection) with each other via the Al contact plugs 25b. The Al damascene wire 25a is electrically connected to the Cu damascene wire 6 via the Al contact plugs 25b. FIG. 6A is a cross-portional view along with the single-dotted chain line E—E in FIG. 6B.

As described above, according to the second embodiment, advantages similar to those of the first embodiment can be obtained. Portions of the SiN film 7 and the $SiO_2$ film 8 are left on the Cu pad portions 6a. That is, a multilayer film of insulation films formed of the SiN film 7 and the $SiO_2$ film 8 is sandwiched (held) between the undersurface of the Al pad portion 25c and the upper surfaces of the Cu pad portions 6a. This improves the adhesive property (adhesion) between the Cu pad portions 6a and the Al pad portion 25c. Consequently, the durability and reliability in the pad portion 26 of the semiconductor device 21 are further improved.

(Third Embodiment)

Figure 8A:
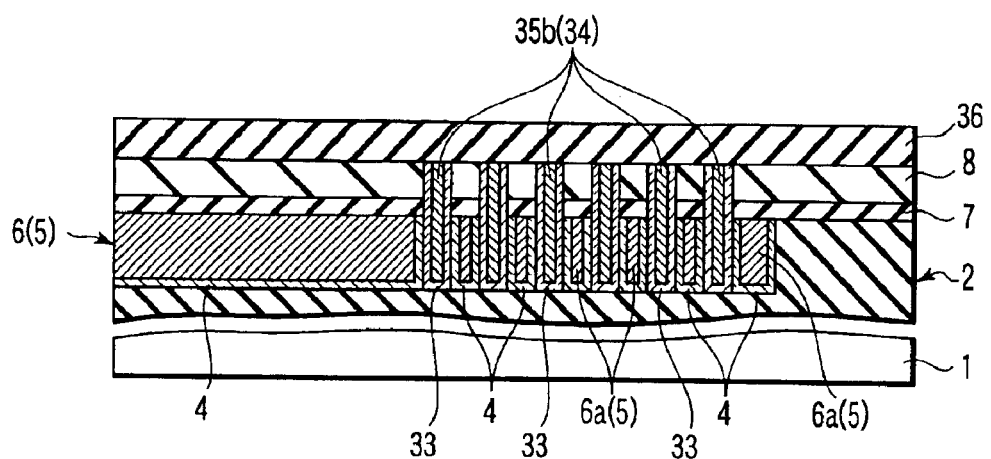
FIG. 8A is a cross-portional view showing an in-process state of the semiconductor device in the manufacturing method according to the third embodiment.
Figure 8B:
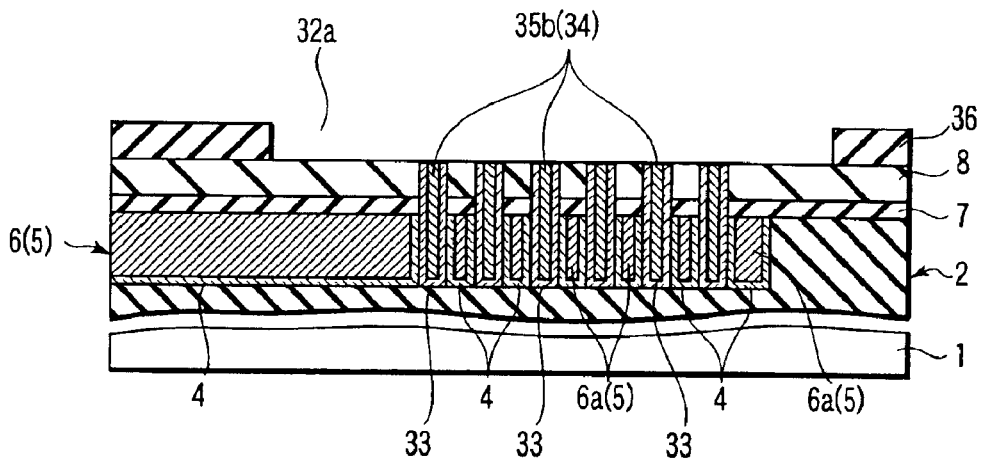
FIG. 8B is a cross-portional view showing an in-process state of the semiconductor device in the manufacturing method according to the third embodiment.
Figure 8C:
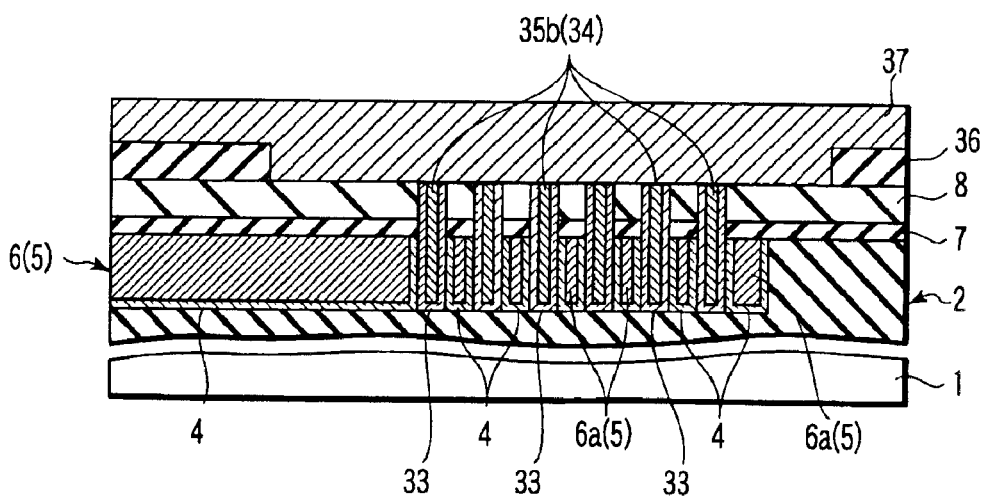
FIG. 8C is a cross-portional view showing an in-process state of the semiconductor device in the manufacturing method according to the third embodiment.
Figure 9A:
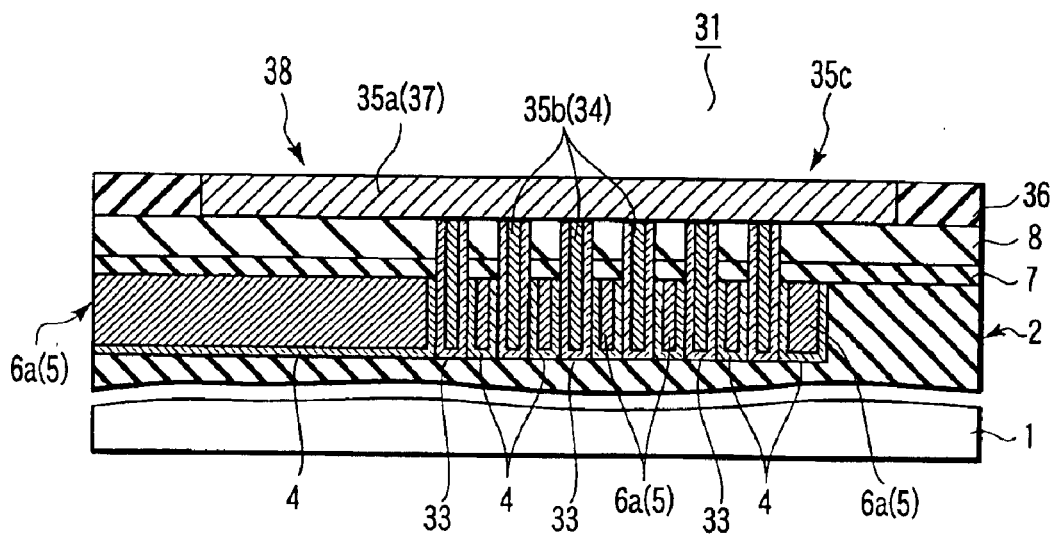
FIG. 9A is a cross-portional view showing an in-process state of the semiconductor device in the manufacturing method according to the third embodiment.
Figure 9B:
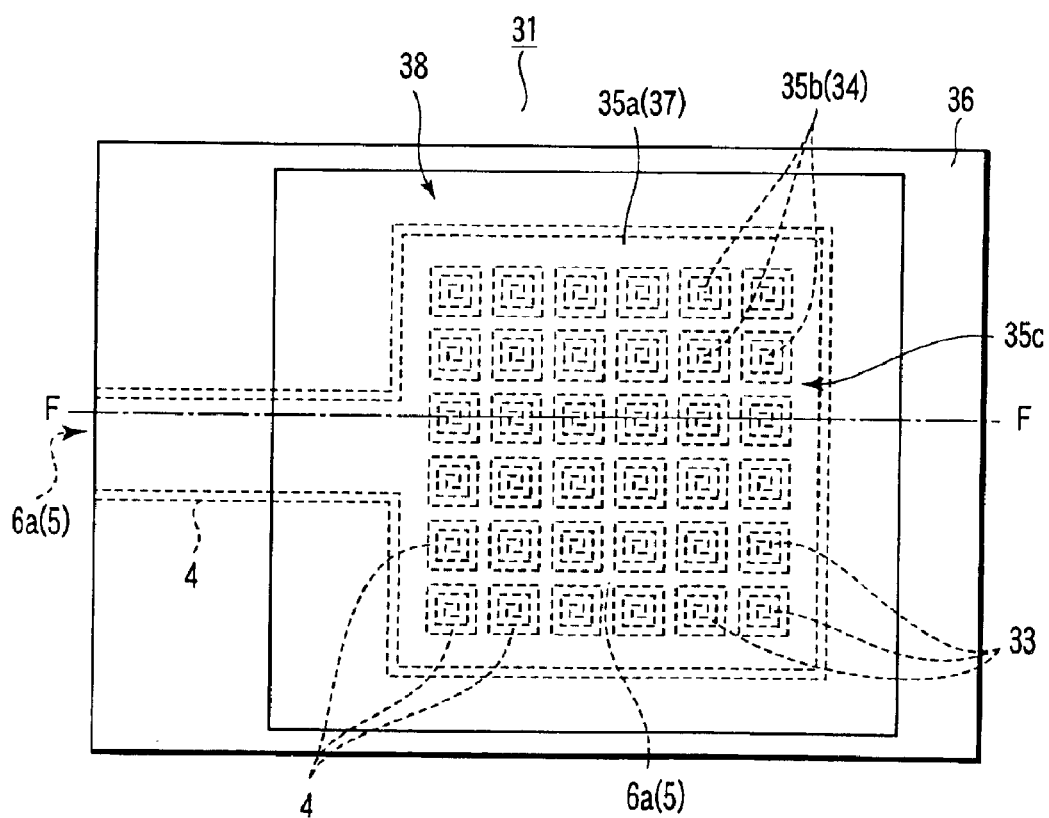
FIG. 9B is a plan view showing an in-process state of the semiconductor device in the manufacturing method according to the third embodiment.

Referring to FIGS. 7A to 9B, a third embodiment will now be described hereunder. FIGS. 7A to 8C are cross-portional views each showing an in-process state of a semiconductor device in a manufacturing method according to the third embodiment. FIGS. 9A and 9B are a cross-portional view and a plan view, respectively, each showing an in-process state of the semiconductor device and the manufacturing method thereof according to the third embodiment. The same numerals are used to refer to the same portions as those in the first embodiment, and detailed description thereof will be omitted therefrom.

The present embodiment is different from the first and second embodiments in that the second wire is formed to be a so-called single damascene structure. The semiconductor device according to the present embodiment and the manufacturing method thereof will be described collectively along the sequence of manufacturing steps.

With reference to FIG. 7A, using steps similar to those in the first and second embodiments, an SiN film 7 and an $SiO_2$ film 8 are sequentially laminated onto an $SiO_2$ film 2 in which a Cu damascene wire 6 and the like are formed. Subsequently, contact holes 32b are formed in portions extending from the upper surface of the $SiO_2$ film 8 to the inner portions of the residual $SiO_2$ film 2 in the Cu pad portions 6a. Then, a second wire 35a of the present embodiment is formed separately from contact plugs 35b in, as described above, a different manner from the cases of the second wire 12a of the first embodiment and the second wire 25a of the second embodiment. The second wire 35a of this embodiment is formed to be a so-called single damascene structure (single damascene wire). Accordingly, the contact holes 32b are formed as independent objects from a recess for the second wire 32a. In detail, the contact holes 32b are formed by an RIE process that etches and removes the residual $SiO_2$ film 2a, the SiN film 7 on the residual $SiO_2$ film 2a, and the $SiO_2$ film 8 on the Cu pad portions 6a. The contact holes 32b are thus formed to pass through the residual $SiO_2$ film 2a, the SiN film 7 on the residual $SiO_2$ film 2a, and the $SiO_2$ film 8 on the residual $SiO_2$ film 2a. Similar to the each of the contact holes 9b and 22b in the respective first and second embodiments, the each contact hole 32b in the present embodiment is also formed to have the bottom portion (lower end portion) positioned at substantially the same height as the undersurface (lower end portion) of the Cu pad portion 6a. That is, the each contact hole 32b is formed to pass through the Cu pad portion 6a.

Subsequently, referring to FIG. 7B, a barrier metal film 33 which is an independent object from the TaN film 4, and a forming material for the contact plugs 35b are sequentially laminated on the surface of the $SiO_2$ film 8 and the contact holes 32b. More specifically, the TaN film 33, which works as the barrier metal film, is first deposited by a PVD process on the surface of the $SiO_2$ film 8 and in the individual inner portions of the contact holes 32b. Subsequently, an Al film 34 (second conductive material) to be used as a forming material for the contact plugs 35b is deposited also by a PVD process onto the surface of the TaN film 33 in such a manner as to fill the individual inner portions of the contact holes 32b to a desired thickness.

Subsequently, referring to FIG. 7C, unnecessary portions of the TaN film 33 and Al film 34 are removed. More specifically, the unnecessary portions of the TaN film 33 and the Al film 34 are polished and removed by a CMP process. Thereby, the TaN film 33 and the Al film 34 are buried in the contact holes 32b, and the contact plugs 35b are thereby formed.

Subsequently, referring to FIG. 8A, a third insulation film 36 is formed by a process such as a CVD process to a desired thickness onto the $SiO_2$ film 8 in which the contact plugs 35b and the like are formed. The present embodiment employs an $SiO_2$ film for the third insulation film 36.

The recess 32a is then formed above the contact plugs 35b, that is, above the Cu pad portions 6a, as shown in FIG. 8B. More specifically, only an SiO₂ film 36 portion above the Cu pad portions 6a is etched and removed by a process such as an RIE process to allow the surfaces of the SiO₂ film 8 and the contact plugs 35b to be exposed. Thereby, recess 32a is formed to pass through the SiO₂ film 36. In addition, portions of the SiN film 7 and the SiO₂ film 8 are left on the Cu pad portions 6a. Thereby, the second wire 35a is formed such that the undersurface thereof is spaced apart from the upper surface of the pad portions 6a of the Cu damascene wire 6 that works as the first wire.

Subsequently, referring to FIG. 8C, a forming material for the second wire 35a is provided on the surface of the SiO₂ film 36 and in the inner portion of the recess 32a. In more detail, a film 37 of a third conductive material, which is to be used as a forming material for the second wire 35a, is formed by a PVD process to a desired thickness on the surface of the SiO₂ film 8 and in the inner portion of the recess 32a. In the present embodiment, the second wire 35a is formed of the same Al material as for the contact plugs 35b. Accordingly, the same Al material as the second conductive material is used for the third conductive material. That is, the film 37 formed of Al is formed on the surface of the SiO₂ film 8 and in the inner portion of the recess 32a. In addition, in the present embodiment, since both the second wire 35a and contact plugs 35b are formed of Al, a barrier metal film need not be formed around the second wire 35a.

Subsequently, referring to FIG. 9A, unnecessary portions of the Al film 37 is removed. More specifically, a wiring pattern of the second wire 35a is patterned on the surface of the Al film 37 by a photoresist process. Thereafter, a process such as an RIE process is applied to process the Al film 37 for removing unnecessary portions of the Al film 37. Thereby, the Al film 37 is buried in the recess 32a, and the second wire 35a is formed. Consequently, the second wire 35a is formed to be a single damascene structure formed as an independent object from the contact plugs 35b by using Al. Thus, an Al single damascene wire 35a is formed as the second wire 35a onto the pad portions 6a of the Cu damascene wire 6. Description hereinbelow may use the name "Al pad portion 35c" to refer to a portion of the Al single damascene wire 35a above the Al contact plugs 35b and the Cu pad portions 6a. Also, the Al single damascene wire 35a may simply be referred to as the "Al damascene wire 35a."

Subsequently, predetermined steps are carried out, and a semiconductor device 31 is obtained, as shown in FIGS. 9A and 9B. Specifically, the semiconductor device 31 has a pad portion 38 structured such that the second wire 35a is formed to be the single damascene structure. In addition, the undersurface of the Al pad portion 35c is spaced apart from the upper surface of the Cu pad portions 6a, and the Al pad portion 35c and the Cu pad portions 6a are in three-dimensionally contact (connection) with each other via the Al contact plugs 35b. The Al damascene wire 35a is electrically connected to the Cu damascene wire 6 via the Al contact plugs 35b. FIG. 9A is a cross-portional view along with the single-dotted chain line F—F in FIG. 9B.

As described above, according to the third embodiment, while the Al damascene wire 35a as the second wire is formed to be the single damascene structure, advantages similar to those of the individual first and second embodiments can be obtained.

(Fourth Embodiment)

Figure 10A:
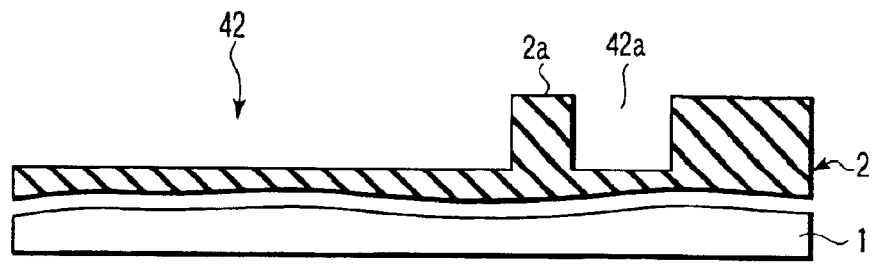
FIG. 10A is a cross-portional view showing an in-process state of the semiconductor device in a manufacturing method according to a fourth embodiment of the present invention.
Figure 10B:
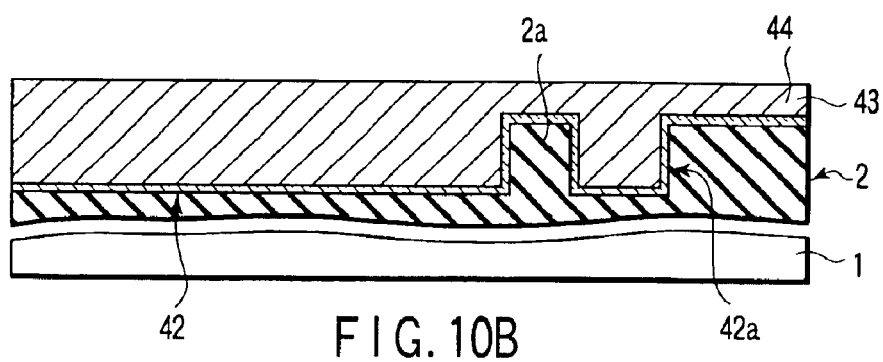
FIG. 10B is a cross-portional view showing an in-process state of the semiconductor device in the manufacturing method according to the fourth embodiment.
Figure 10C:
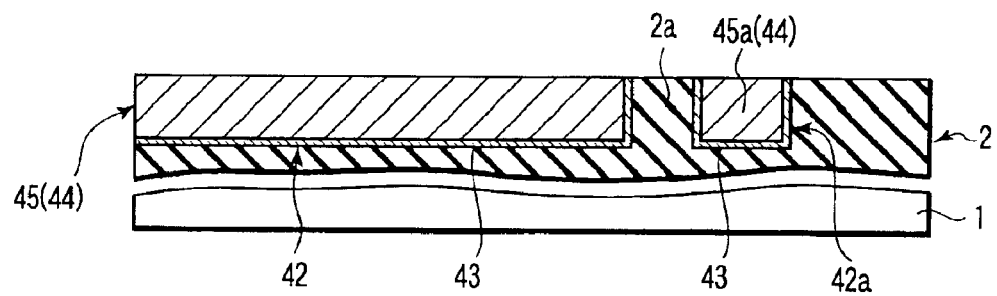
FIG. 10C is a cross-portional view showing an in-process state of the semiconductor device in the manufacturing method according to the fourth embodiment.
Figure 10D:
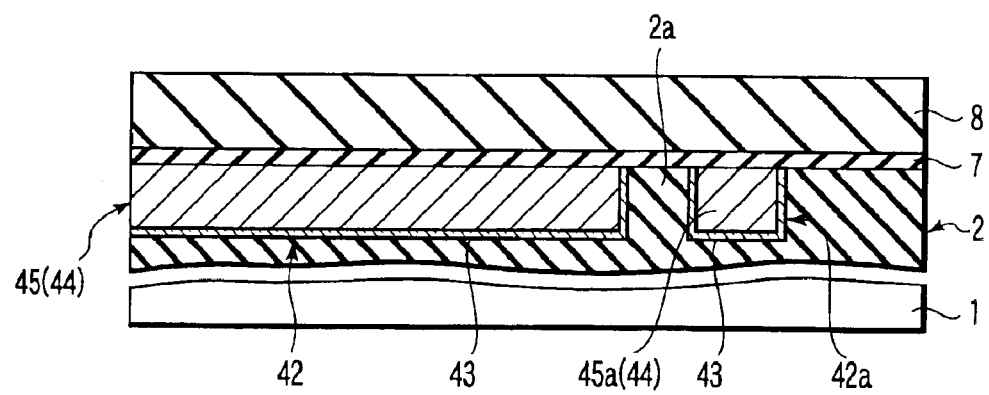
FIG. 10D is a cross-portional view showing an in-process state of the semiconductor device in the manufacturing method according to the fourth embodiment.
Figure 11A:
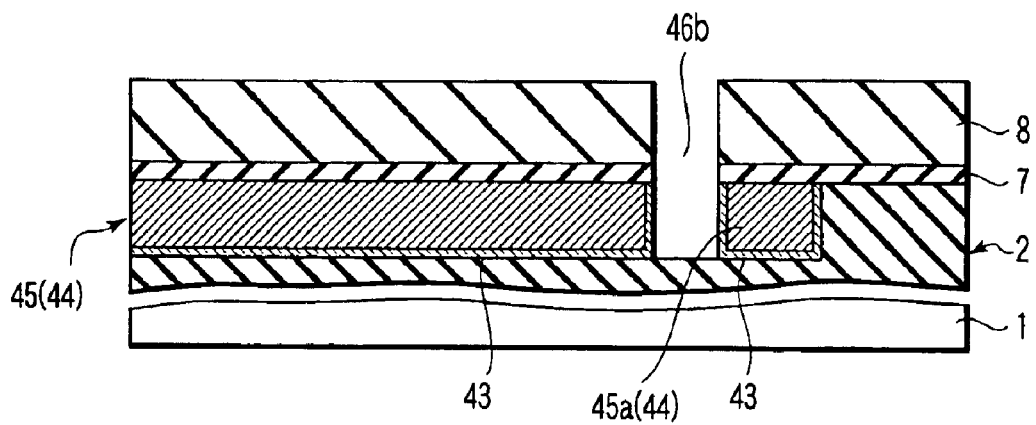
FIG. 11A is a cross-portional view showing an in-process state of the semiconductor device in the manufacturing method according to the fourth embodiment.
Figure 11B:
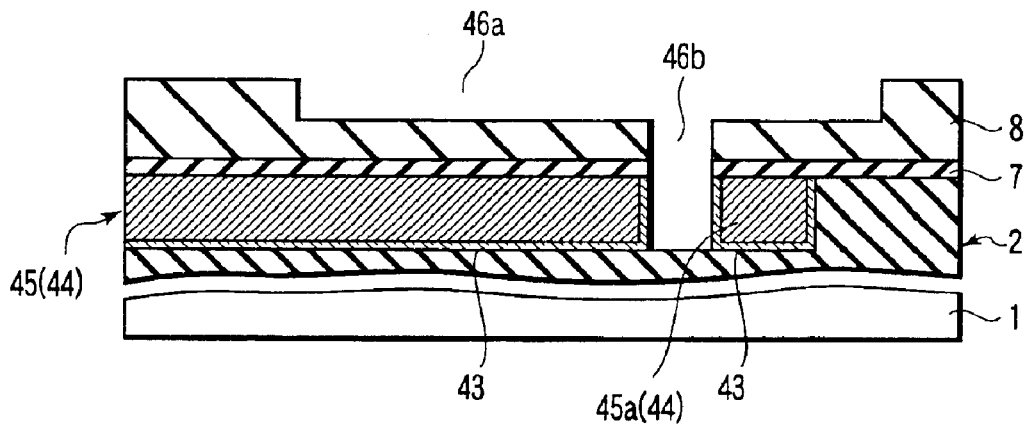
FIG. 11B is a cross-portional view showing an in-process state of the semiconductor device in the manufacturing method according to the fourth embodiment.
Figure 11C:
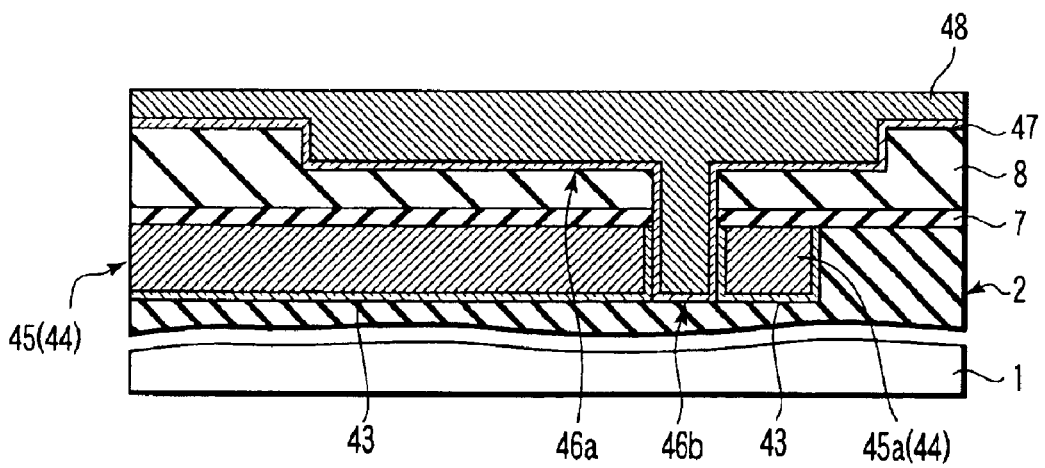
FIG. 11C is a cross-portional view showing an in-process state of the semiconductor device in the manufacturing method according to the fourth embodiment.
Figure 12A:
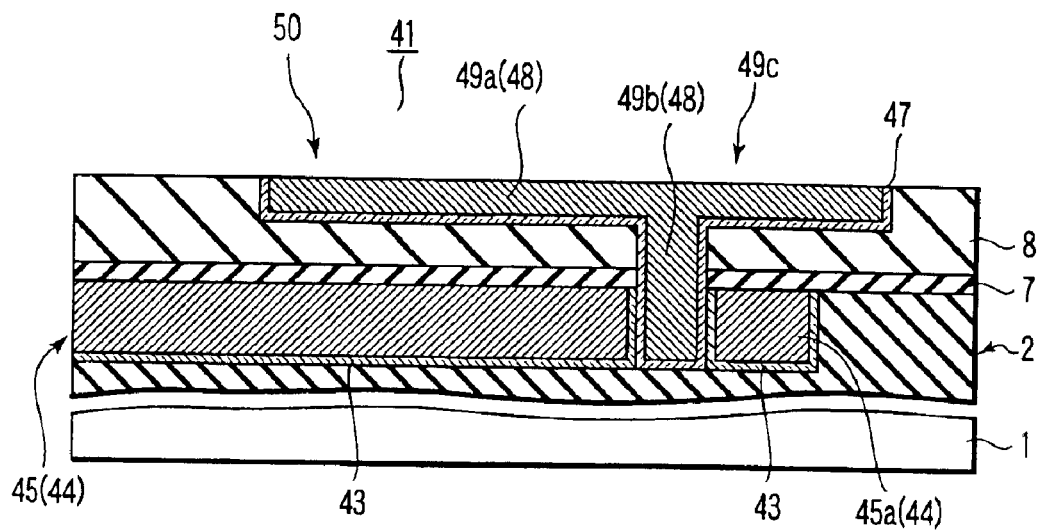
FIG. 12A is a cross-portional view showing an in-process state of the semiconductor device in the manufacturing method according to the fourth embodiment.
Figure 12B:
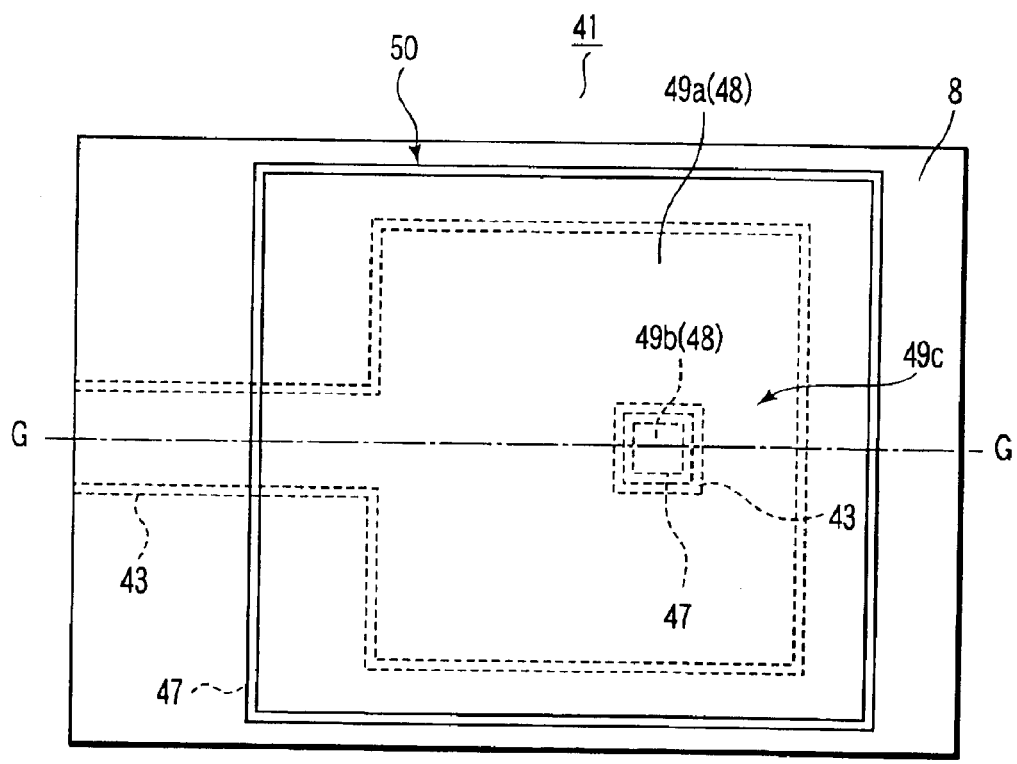
FIG. 12B is a plan view showing an in-process state of the semiconductor device in the manufacturing method according to the fourth embodiment.

Referring to FIGS. 10A to 12B, a fourth embodiment of the present invention will now be described hereunder. FIGS. 10A to 11C are cross-portional views each showing an in-process state of a semiconductor device in a manufacturing method according to the fourth embodiment. FIGS. 12A and 12B are a cross-portional view and a plan view, respectively, each showing an in-process state of the semiconductor device and the manufacturing method according to the fourth embodiment. The same numerals are used to refer to the same portions as those in the fourth embodiment, and detailed description thereof will be omitted herefrom.

As in the individual first and second embodiments, the second wire is formed to be a dual damascene structure in the fourth embodiment. However, only one contact plug is formed in the present embodiment. The semiconductor device according to the present embodiment and the manufacturing method thereof will be described collectively along the sequence of manufacturing steps.

With reference to FIG. 10A, using steps similar to those in the first embodiment, an SiO₂ film 2 is deposited above the surface of an Si substrate 1. Subsequently, a wiring pattern of a first wire 45 is patterned on the surface of the SiO₂ film 2 by a photoresist process. Then, the SiO₂ film 2 is processed by an RIE process, and a recess for the first wire 42 is thereby formed. In this step, the SiO₂ film 2 is etched such that only one substantially four-sided columnar residual SiO₂ film 2a is formed in an inner portion of a recess for a pad portion of the first wire 42a.

Subsequently, referring to FIG. 10B, a TaN film 43 working as a barrier metal film is first deposited by a PVD process onto individual inner portions of the recess 42 and the recess 42a that are formed above the surface of the SiO₂ film 2. Subsequently, a Cu plating seed layer (film) (not shown) to be used as a base of the first wire 45 is deposited onto the surface of the TaN film 43 also by the PVD process. Thereafter, a Cu film 44 (first conductive material) used as a forming material for the first wire 45 is deposited onto the surface of the Cu plating seed layer in such a manner as to fill the individual inner portions of the recess 42 and the recess 42a.

Subsequently, with reference to FIG. 10C, unnecessary portions of the TaN film 43 and Cu film 44 are polished and removed by a CMP process. Then, the TaN film 43 and the Cu film 44 are buried in the recess 42 and the recess 42a. Thereby, a Cu damascene wire 45 working as the first wire and a Cu pad portion 45a therefor are formed. In this case, the first wire 45 and the Cu pad portion 45a are formed parallel to each other.

Subsequently, referring to FIG. 10D, an SiN film 7 and an SiO₂ film 8 working as a second insulation film are sequentially laminated onto the surface of the SiO₂ film 2 in which the Cu damascene wire 45 and the like are sequentially laminated.

Next, referring to FIG. 11A, a contact hole 46b is formed in a region extending from the SiO₂ film 8 above the Cu pad portion 45a to the residual SiO₂ film 2 in the Cu pad portion 45a. In more detail, the contact hole 46b is formed by a process such as an RIE process that etches and removes the residual SiO₂ film 2a, the SiN film 7 on the residual SiO₂ film 2a, and the SiO₂ film 8 on the SiO₂ film 2. Also in the present embodiment, the contact hole 46b is formed to have the bottom portion (lower end portion) positioned at substantially the same height as the undersurface (lower end portion) of the Cu pad portion 45a as in the respective holes 9b, 22b, and 32b of the above described first to third embodiments. That is, the contact hole 46b is formed to pass through the Cu pad portion 45a.

Subsequently, referring to FIG. 11B, a recess for a second wire 46a is formed above the contact hole 46b. As in the second wires 12a and 25a of the respective first and second embodiments, also a second wire 49a is formed integrally with a contact plug 49b. That is, the second wire 49a is formed to be a dual damascene structure (dual damascene wire). As such, the recess 46a is integrally formed in connection to the contact hole 46b. In more detail, the $SiO_2$ film 8 is etched and removed from its upper surface (surface) to the inner portion by an RIE method so as to extend the opening portion of the contact hole 46b. Thus, the recess 46a for passing through the upper end portion of the contact hole 46b is formed.

The recess 46a is formed in the shape not to pass through the $SiO_2$ film 8. That is, portions of the SiN film 7 and the $SiO_2$ film 8 are left on the Cu pad portion 45a. Consequently, the second wire 49a is formed such that the undersurface thereof is spaced away from the upper surface of the of the pad portions 45a of the Cu damascene wire 6 (first wire). Similar to the recess 9a and the contact holes 9b in the first embodiment and the recess 22a and the contact holes 22b in the second embodiment, either one of the recess 46a and the contact holes 46b may be formed earlier than the other.

Subsequently, referring to FIG. 11C, a barrier metal film 47, which is an independent object from the barrier metal film 43, and a forming material for the second wire 49a are sequentially laminated onto the surface of the $SiO_2$ film 8 and in individual inner portions of the recess 46a and contact hole 46b. More specifically, the TaN film 47, which works as the barrier metal film, is first deposited by a PVD process on the surface of the $SiO_2$ film 8 and in the individual inner portions of the recess 46a and contact hole 46b. Subsequently, an Al film 48 (second conductive material) to be used as a forming material for the second wire 49a is deposited also by a PVD process onto the surface of the TaN film 47 in such a manner as to fill the individual inner portions of the recess 46a and contact hole 46b to a desired thickness.

Subsequently, referring to FIG. 12A, unnecessary portions of the TaN film 47 and Al film 48 are removed. More specifically, a wiring pattern of the second wire 49a is patterned on the surface of the Al film 48 by a process such as a photoresist process. Thereafter, a process such as an RIE process is applied to process the TaN film 47 and the Al film 48 for removing unnecessary portions of the TaN film 47 and Al film 48. Thereby, the TaN film 47 and the Al film 48 are buried in the recess 46a, and the second wire 49a is formed. Concurrently, the TaN film 47 and the Al film 48 are buried in the contact hole 46b, and the contact plug 49b is formed. Consequently, the second wire 49a is formed to be a dual damascene structure formed integrally with the contact plug 49b by using Al. Thus, an Al dual damascene wire 49a is formed as the second wire 49a above the pad portions 45a of the Cu damascene wire 45. Description hereinbelow may use the name "Al pad portion 49c" to refer to a portion of the Al dual damascene wire 49a above the Al contact plug 49b and the Cu pad portions 6a. Also, the Al dual damascene wire 49a may simply be referred to as the "Al damascene wire 49a."

Subsequently, predetermined steps are carried out, and a semiconductor device 41 is obtained, as shown in FIGS. 12A and 12B. The semiconductor device 41 has a pad portion 50 structured such that the undersurface of the Al pad portion 49c is spaced apart from the upper surface of the Cu pad portion 45a. In addition, the Al pad portion 49c and the Cu pad portion 45a are in three-dimensional contact (connection) with each other via the one contact plug 49b. The Al damascene wire 49a is electrically connected to the Cu damascene wire 6 via the one contact plug 49b. FIG. 12A is a cross-portional view along with the single-dotted chain line G—G of FIG. 12B.

As described above, according to the fourth embodiment, even with the one Al contact plug portion 49b, the Al damascene wire 49a and the Cu damascene wire 45 are in three-dimensional contact with each other. Further, the insulation film is sandwiched (held) between the undersurface of the Al pad portion 49c and the upper surfaces of the Cu pad portions 6a. Consequently, advantages similar to those of the individual first to third embodiments described above can be obtained.

The semiconductor device and the manufacturing method according to the present invention are not limited by the individual first to fourth embodiments described above. The configurations or manufacturing steps thereof may be executed by being partly modified to those with various settings or may be used in appropriate combinations of the individual settings.

For example, the length of the contact plug is not limited to be substantially the same as the thickness of the first wire. The length of the contact plug may be shorter or longer than the thickness of the first wire. The length may be optionally determined as long as the first and second wires can be in three-dimensional contact with each other. However, with the contact plug formed to a length longer than the thickness of the first wire, the contact plug is brought into indirect contact with the first insulation film, thereby enabling the adhesive property (adhesive strength) between the second wire and the first wire to be even further improved.

The shape of the contact plug is not limited to the four-sided columnar shape. The shape may be any one of round columnar, elliptical columnar, triangular columnar, and polygonal columnar shapes. The plug portion of the second wire may be formed to any one of plan-view shapes like, for example, a predetermined letter, figure, and numeral individually formed of a linear or nonlinear shape. That is, the plug portion may be formed in any shape as long as the plug portion allows the second wire and the first wire to be in three-dimensional contact with each other. The number of the contact plugs may be set to an appropriate value depending on the necessity.

The second wire needs not to be formed of an aluminium monomer. The second wire may be formed of any material having a high electric conductivity and a sufficient oxidation resistance. For example, in the second wire, the main body portion to be exposed to the atmosphere may be formed of a compound containing aluminium. In the second wire having the single damascene structure according to the third embodiment, the main body portion and plug portion thereof may be individually formed of different materials.

The pad portion of the first wire and the contact hole formed in the inner portion thereof may be formed in steps different from those disclosed in the individual first to fourth embodiments. Example modified steps are described hereunder. When the first wire pad portion is formed, the first insulation film in the recesses for the pad portion is completely removed, and the recesses for the pad portion are then fully filled with the first conductive material. Thereby, the first wire pad portions are formed. In this stage, the first insulation film does not remain in the first wire pad portions. Thereafter, contact holes of desired size, shape, and quantity are formed in the first wire pad portion. In addition, the contact hole may be formed before the second insulation film and the like are provided onto the first wire pad portion. In this case, a predetermined portion of the first wire pad portion is removed by, for example, etching, to form the contact hole. Subsequently, the second insulation film and the like are provided onto the first wire pad portion. Then, the recess for the second wire are formed by etching and removing the second insulation film to be connected to the contact hole. When the inner portion of the contact hole is filled (blocked) with the second insulation film and the like, the second insulation film and the like may be concurrently removed. By these steps, similar to the cases of the individual first to fourth embodiments, the desired contact hole(s) and the recesses for the second wire can be formed.

Alternatively, before the second insulation film and the like are provided onto the first wire pad portion, a mask member is provided on the contact hole such that the inner portion of the contact hole is not filled with the second insulation film and the like. Subsequently, after the second insulation film and the like is provided onto the first wire pad portion, the recess for the second wire is then formed by etching and removing the second insulation film, the mask member, and the like so as to be connected to the contact hole. Even by these steps, similar to the cases of the individual first to fourth embodiments, the desired contact hole(s) and the recess for the second wire can be formed.

Still alternatively, after the second insulation film and the like are provided onto the first wire pad portion, a predetermined portion of the first wire pad portion is etched together with the second insulation film and the like existing thereon. Thereby, a desired contact hole can be formed in the state where substantially no events occur in which the inner portion of the contact hole is filled with the second insulation film and the like. Thereafter, the second insulation film, the mask member, and the like are etched and removed, and the recess for the second wire is thereby formed so as to be connected to the contact hole. Even by these steps, similar to the cases of the individual first to fourth embodiments, the desired contact hole(s) and the recess for the second wire can be formed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first wire and a pad portion thereof provided in a portion from an upper surface to an inner portion of a first insulation film provided above a substrate;
   a second insulation film provided on the first insulation film and the first wire;
   a second wire provided to be exposed from an upper surface of the second insulation film in an upper portion of the pad portion of the first wire; and
   a contact plug provided to reach an inner portion of the pad portion of the first wire from an undersurface of the second wire.

2. The device according to claim 1, wherein at least a side portion of the contact plug is electrically connected to the pad portion of the first wire.

3. The device according to claim 1, wherein the second wire is provided with a pad portion having an undersurface spaced apart from the upper surface of the pad portion of the first wire.

4. The device according to claim 1, wherein the contact plug is formed integrally with the second wire.

5. The device according to claim 1, wherein the second wire and the contact plug are formed of at least one of an aluminium monomer and a compound containing aluminium.

6. The device according to claim 1, wherein a plurality of the contact plugs are provided.

7. The device according to claim 2, wherein the contact plug is provided with a lower end portion positioned at a height that is the same as or lower than that of the undersurface of the pad portion of the first wire.

8. The device according to claim 3, wherein the second insulation film is sandwiched between the undersurface of the pad portion of the second wire and the upper surface of the pad portion of the first wire.

* * * * *